(12) United States Patent  
Horovitz et al.

(10) Patent No.: US 9,923,563 B1  
(45) Date of Patent: Mar. 20, 2018

(54) DETERMINISTIC JITTER REMOVAL USING A CLOSED LOOP DIGITAL-ANALOG MECHANISM

(71) Applicant: Intel IP Corporation, Santa Clara, CA (US)

(72) Inventors: Gil Horovitz, Emek-Hefer (IL); Elan Banin, Raanana (IL); Igal Kushnir, Hod-Hasharon (IL); Aryeh Farber, Petah Tikva (IL); Ran Krichman, Hadera (IL); Ofir Degani, Haifa (IL); Rotem Banin, Pardes-Hana (IL)

(73) Assignee: Intel IP Corporation, Santa Clara, CA (US)

( * ) Notice: Subject to any disclaimer, the term of this patent is extended or adjusted under 35 U.S.C. 154(b) by 0 days.

(21) Appl. No.: 15/389,520

(22) Filed: Dec. 23, 2016

(51) Int. Cl.  
*H03L 7/08* (2006.01)

(52) U.S. Cl.  
CPC .............. *H03L 7/08* (2013.01); *H03L 7/0805* (2013.01)

(58) Field of Classification Search  
CPC ................................ H03L 7/08; H03L 7/0805  
See application file for complete search history.

(56) References Cited

U.S. PATENT DOCUMENTS

| | | | |
|---|---|---|---|
| 8,489,053 B2 * | 7/2013 | Peavey | H03L 7/0805 331/1 R |
| 8,878,577 B2 * | 11/2014 | Waltari | H03L 7/091 327/147 |
| 9,231,602 B1 * | 1/2016 | Banin | G04F 10/005 |

OTHER PUBLICATIONS

Sotiriadis, Paul P. et al. "Direct All-Digital Frequency Synthesis Techniques, Spurs Suppression, and Deterministic Jitter Correction." IEEE Transactions on Circuits and Systems—I: Regular Papers, vol. 59, No. 5, May 2012. pp. 958-968.

* cited by examiner

*Primary Examiner* — Patrick O'Neill  
(74) *Attorney, Agent, or Firm* — Eschweiler & Potashnik, LLC

(57) ABSTRACT

A digital phase lock loop (DPLL) device or system can operate to analyze and estimate a deterministic jitter in the digital domain, while correcting for it in the analog domain. A reference oscillator can provide an analog reference signal to the DPLL via a reference path. A shaper of the reference path can process the analog reference signal and provide a digital signal to a doubler component that doubles the frequency for a digital reference signal. The doubler component itself can add deterministic jitter to the noise of the digital reference signal it provides to the DPLL. An estimation of the DPLL performs various calibration processes to determine the deterministic jitter in the digital domain and provide an analog bias signal to the signal shaper component to correct for the deterministic jitter, keeping it at around zero.

25 Claims, 8 Drawing Sheets

DETERMINISTIC JITTER REMOVAL USING A CLOSED LOOP DIGITAL-ANALOG MECHANISM

FIELD

The present disclosure relates to deterministic jitter, and more specifically, to removing deterministic jitter with closed loop digital-analog mechanisms.

BACKGROUND

Phase locked loops (PLLs) can provide precise generation and alignment of timing for a wide variety of applications, such as for clock generation or clock data recovery. Digital phase-lock(ed) loops (DPLLs) are a viable alternative to traditional PLLs, in which a digital loop filter can be utilized to replace analog components. For example, DPLLS provide a low-power-small-area solution relative to analog PLLs. In a DPLL the phase offset between a local oscillator (LO) and a reference clock can be measured by an analog-to-digital convertor that can be considered a time-to-digital converter (TDC). The measured phase is then compared to the required/target phase and the result can be used to correct the LO frequency. In DPLL devices, the reference clock can be used to control a faster clock in order to create a clock signal, which is noisy. The fast clock can be an LO such as a voltage controlled oscillator (VCO), and the reference clock can be a crystal (e.g., a crystal oscillator) to monitor and control the LO. However, increasing the reference signal along a reference path generated by the reference clock can increase the in-band noise such as deterministic jitter. Because the oscillator is an important component involved in tuning the DPLL, which can involve coarse tuning and fine tuning operations, eliminating or mitigating the deterministic jitter can improve the operation and efficiency of the DPLL.

DETAILED DESCRIPTION

Figure 1:
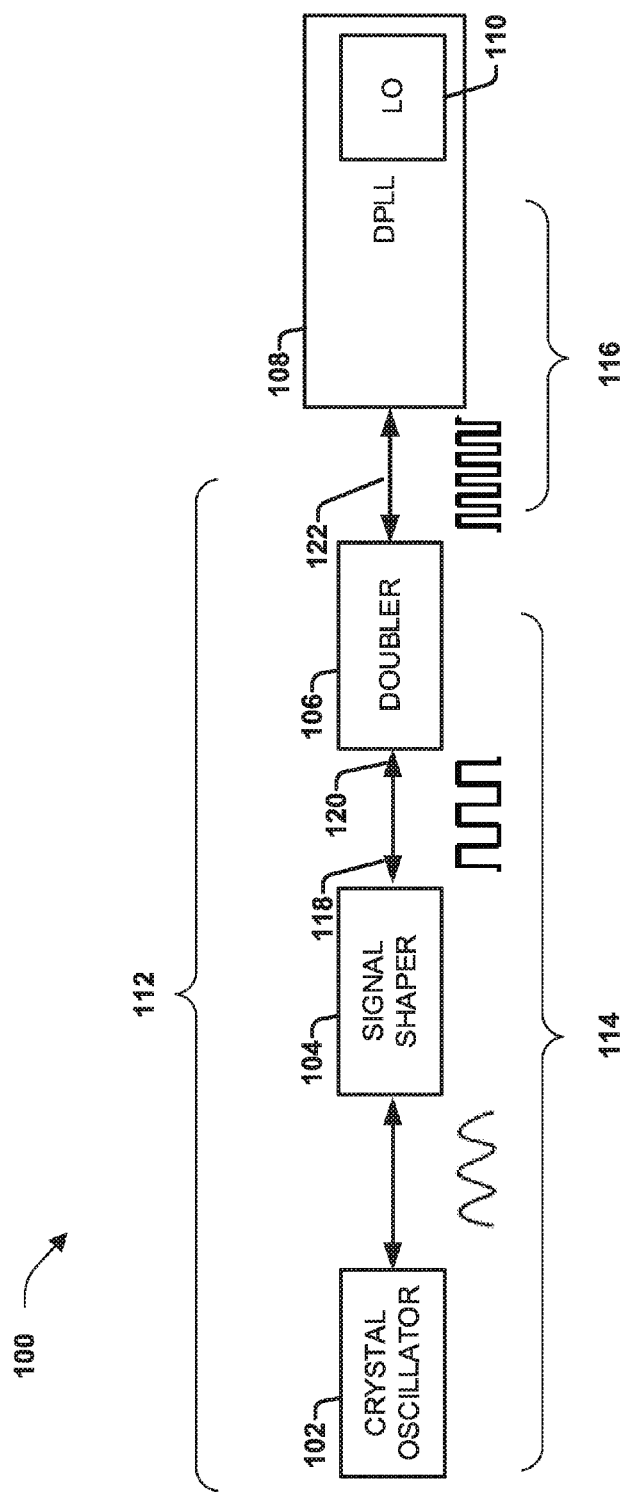
FIG. 1 illustrates a block diagram illustrating an example digital phase locked loop (DPLL) according to various aspects or embodiments.

The present disclosure will now be described with reference to the attached drawing figures, wherein like reference numerals are used to refer to like elements throughout, and wherein the illustrated structures and devices are not necessarily drawn to scale. As utilized herein, terms "component," "system," "interface," and the like are intended to refer to a computer-related entity, hardware, software (e.g., in execution), and/or firmware. For example, a component can be a processor, a process running on a processor, a controller, a circuit, circuitry or a circuit element, an object, an executable, a program, a storage device, a computer, a tablet PC and/or a mobile phone with a processing device. By way of illustration, an application running on a server and the server can also be a component. One or more components can reside within a process, and a component can be localized on one computer and/or distributed between two or more computers. A set of elements or a set of other components can be described herein, in which the term "set" can be interpreted as "one or more."

Further, these components can execute from various computer readable storage media having various data structures stored thereon such as with a module, for example. The components can communicate via local or remote processes such as in accordance with a signal having one or more data packets (e.g., data from one component interacting with another component in a local system, distributed system, and/or across a network, such as, the Internet, a local area network, a wide area network, or similar network with other systems via the signal).

As another example, a component can be an apparatus with specific functionality provided by mechanical parts operated by electric or electronic circuitry, in which the electric or electronic circuitry can be operated by a software application or a firmware application executed by one or more processors. The one or more processors can be internal or external to the apparatus and can execute at least a part of the software or firmware application. As yet another example, a component can be an apparatus that provides specific functionality through electronic components or elements without mechanical parts; the electronic components can include one or more processors therein to execute software and/or firmware that confer(s), at least in part, the functionality of the electronic components.

Use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form. Furthermore, to the extent that the terms "including", "includes", "having", "has", "with", or variants thereof are used in either the detailed description and the claims, such terms are intended to be inclusive in a manner similar to the term "comprising".

Overview

In consideration of the above described deficiencies, various components and techniques are disclosed that enable estimation of the deterministic jitter within a DPLL in a digital domain and correction of the deterministic jitter in an analog domain. Analog impairments can be the source of at least a portion of the deterministic jitter affecting a DPLL system, and be difficult to measure entirely in the analog domain. These impairments can be generated along a reference path to a DPLL from various sources, including components in the digital domain, and can be detected/measured with a feedback control loop connected to the digital domain portion of a reference path of the DPLL and a component (e.g., a signal shaper component) of the analog domain portion of the reference path.

One major factor involved in estimating the deterministic jitter can be an integer ambiguity, in which only the fractional part of the phase differences between the two clocks (e.g., the LO/VCO and the reference clock) can be detected and any integer difference can go undetected. This undetected differential outside of the range (e.g., over 360 degrees) can represent or be referred to as the integer ambiguity, which can be a source of deterministic jitter, and generate noise or further leak from reference path to an antenna port of a wireless system or device utilizing the DPLL.

Because the digital domain is limited by the integer ambiguity when estimating the deterministic jitter, some embodiments disclosed can utilize components (e.g., an estimation component with a TDC) to generate initial measurements or estimations in multiple different frequencies of the LO or VCO. These initial measurements, for example, can be within a calibration mode at manufacture, for example, or during boot-up or powering phase of the DPLL that are before an operational transmission phase. This operational transmission phase can be an active transmission or reception via the antenna port, or after the DPLL is locked on a particular frequency specifically for transmission/reception of wireless data, in a frequency locked state or mode. Thus, a calibration process flow can estimate the impairment in the digital domain, and can then eliminate deterministic jitter source in the analog domain based on the estimation in the digital domain.

In one aspect, a correction or an elimination of the deterministic jitter can be performed by changing a bias point (e.g., a voltage bias) of a component (e.g., a shaper) along the reference path in the analog domain. This can also enable a correction of the deterministic jitter that emanates or is caused by digital components such as the doubler component, which can be a source or cause of deterministic jitter itself. The correction, for example, can be a digital correction converted to an analog correction (an analog bias) that causes a duty cycle correction at the component's output (e.g., a shaper output) to a duty cycle value. The duty cycle correction can change the duty cycle of the signal shaper component, for example, to produce nearly zero deterministic jitter at the DPLL. The correction (duty cycle) value is not necessarily 50% due to the doubler characteristics and other sources of bias or deterministic jitter that could also contributed to noise, deterministic jitter, or leakage to an antenna port in the digital domain of the system. Additional aspects and details of the disclosure are further described below with reference to figures.

FIG. 1 illustrates an example of reference clock generation employed with or in a phase locked loop device in accordance with embodiments or aspects being disclosed. A PLL system such as a DPLL system 100 can include a reference clock component 112 with a crystal oscillator/crystal clock coupled to a signal shaper component 104. The signal shaper component 104 is further coupled to a doubler component 106 and a DPLL component 108, which can include a local oscillator signal from a local oscillator (LO) 110 (e.g., a voltage controlled oscillator (VCO)). The system 100 can operate according to various embodiments/aspects herein to correct for deterministic jitter and reduce spurs to make power and transmissions more efficient by providing a correction in the analog domain based on an estimation or measurement of deterministic jitter, the signal spurs or other impairments in the digital domain enabling deterministic jitter.

The reference path 112 can be in the analog domain 114 and the digital domain 116 begins in the input of the DPLL 108, for example, with the doubler output 122 thereto. For correction in the analog domain along the analog domain path/portion 114 of the reference path 112 based on measurements in the digital domain path 116, the deterministic jitter can be controlled by changing a shaper bias point of the signal shaper component 104. For example, by controlling the input stage bias point or changing the supply voltage to the signal shaper component 104, an offset or modification can be set by a correction signal that can take into account the deterministic jitter affecting the DPLL 108 from the digital domain path 116. This deterministic jitter can be derived from the doubler component 106, or other sources, for example, and not be detected in the analog domain, and corrected by affecting the signal shaper component 104 in the analog domain, such as by altering a duty cycle of the signal shaper component's operation.

The signal shaper component 104 can be configured to create a square signal (as illustrated) by comparing its sine-like (crystal output) input to a threshold (e.g., a bias threshold, a V-bias, or other threshold), and performing a truncation/amplification of the signal. Changing a voltage bias or V-bias, for example, can affect this threshold and further change the duty cycle of the shaper output 118, which can be something other than 50% or zero percent, for example.

The doubler component 106 can be configured to utilize the falling edges to create new rising edges, resulting in a doubled frequency in signal output 122 to the DPLL 108. By changing the signal shaper component's duty-cycle such as by a control loop from the DPLL 108 to the shaper 104, the distance between even and odd rising-edges can be controlled at the doubler's output as well as the duty cycle at the shaper's output 118, and thus an amount of phase error that occurs in the digital domain can be accounted for as well as in the analog domain along the reference path 112 to the DPLL.

In the DPLL system 100, a phase offset between an LO 110 with the reference clock 102 can be measured by the DPLL 108 (e.g., with an analog-to-digital convertor (e.g., a TDC)). The phases of the digital signals of the reference path can be measured relative to the LO 110 (e.g., a voltage controlled oscillator or other local oscillator). The measured phase(s) can be compared to a required/target phase and be corrected. Afterwards, the result can then be used to correct the digital reference signal to the DPLL 108 in order to efficiently control or modulate the LO frequency for various applications (e.g., wireless communications via an antenna or antenna port) where a phase drift is detected.

An amount of phase error larger than LO signal period or cycle can indicate integer ambiguity that is unaccounted for by any other compensation and an amplitude or value of the estimated deterministic jitter can be determined based on these calibration processes being performed at multiple different frequencies of the LO 110. After being in operational mode, however, the LO is not able to be altered and so the integer ambiguity is not taken into account, even though online tracking and correction of the deterministic jitter can still be performed to correct for effects of voltage, time or process variations of the system.

The integrated phase noise (IPN), in particular, can be dominated by the LO/VCO phase noise and the reference clock path noise of the reference path noise floor from the reference path 112. This noise floor can be improved by increasing the sampling rate along the reference path 112. For example, the crystal clock rate of the crystal clock 102 can be increased by the doubler component 106, which is configured to convert falling edges of the signal along the reference path to new rising edges and effectively doubling the frequency.

However, operation of the doubler component 106, for example, can cause by-product spurs due to asymmetry between even and odd edges at the output of the doubler component 106. A symmetric square wave at an input 120 of the doubler 106 could contain only odd harmonics, while an asymmetric wave also contains even harmonics, for example. Thus, the doubler component 106 itself could generate many unwanted spurs and be a source of at least a part of the deterministic jitter detected in or at the DPLL 108, for example, along the reference path 112, which could otherwise go undetected. These impairments, which can be from various sources along the reference path 112, as well as other sources of the system 100, can be referred to as deterministic jitter. The deterministic jitter can result from more than one source than just the doubler 106 in the PLL system 100. Sources of signal spurs as part of the deterministic jitter can further impact the DPLL 108 functionality (possibly causing the loss of a PLL frequency lock in an active transmission or operation mode of a communication/mobile device) and degrade phase noise performance, also affecting the error vector magnitude (EVM) of a transmitter/receiver of the system 100. Further, as the reference clock component 102 is distributed, these impairments can affect other communications or communication functions as well such as in or over a network or cellular communication. As such, there is a need to establish strong and efficient DPLL signals that do not affect the antenna port of the communication device (transmitter Tx/receiver Rx).

The reference path 112 can be kept active in many of the system low power modes (due to long wake-up times of the crystal 102 and the fact that in some cases the system could utilize reference clock signal even in a standby mode or sleep mode of operation), therefore there is high motivation to reduce the power consumption of these components (e.g., the signal shaper component 104, the doubler component 106) along the reference path 112. One way for reducing the power, and thus the deterministic jitter, is designing low power, single ended CMOS blocks (e.g., crystal/reference component, shaper and doubler). These circuits can suffer from inherent offsets that can cause phase drifting in operation, thus generating or adding to the deterministic jitter being experienced in the DPLL 108.

In DPLL systems, various applications can call for the generation of a clock signal that can be noisy, and desire a reference clock to control a fast clock. The fast clock can be the LO 110 (or the VCO), and the crystal clock 102 (or the reference clock) can be used to monitor, control or modulate the LO signals from the LO 110. The frequency of the reference clock component 102 (as a slower clock compared to the LO/VCO 110) can be used to control the faster clock (e.g., the LO 110) and to determine the in-band noise, or the noise in the lower frequency. A faster reference clock can improve the in-band noise. For example, a 3 dB improvement in the in-band noise can be obtained by doubling the crystal, or the reference clock 102.

In one example, the reference clock component 102 can be a frequency of about 38.4 MHZ, and by doubling it (e.g., via a doubler component 106) by using the crystal clock 102 rising edge(s) and falling edge(s), the doubler component 106 can increase clock frequency (e.g., by using the older falling edges to be newer generated rising edges of the new even rising edges) without adding to the jitter noise. For example, the doubler component 106 can generate about a 76.8 MHz frequency signal from the square wave 38.4 MHz signal at the output of the signal shaper component 104. However, the doubler component 106 or its operations can add a deterministic noise, or deterministic jitter, which is at about half of the frequency of the new clock signal or of the frequency of the previous clock signal. The doubler itself could generated deterministic jitter from being inline or from internal mechanisms of the doubler itself. If there is a duty cycle in the original clock signal, then it can also result in jitter in the new clock signal as well.

The analog impairments from the analog domain path 114 of the reference path 112, which can be the cause deterministic jitter, can be difficult to measure in the analog domain. However, these analog impairments in the reference path 112 of the DPLL system 100 generate impairments within the DPLL 108, which can be more easily detected and measured. As such, the DPLL 108 or components of the system 100 can generate an estimation of the deterministic jitter effect within the DPLL 108 in the digital domain path 116 and provide a correction of the root-cause of the problem in the analog domain path 114. This way the estimation can be simpler and more accurate, and the compensation can be done with a single analog correction for the sum of the analog impairments that cause deterministic jitter and its associated effects throughout the system.

The digital domain path 116 or digital signals of the reference path 112 can be limited by integer ambiguity when estimating deterministic jitter. As such, the DPLL 108 can generate initial measurements among multiple different frequencies of the LO 110 or VCO in the digital domain and utilize these measurements for corrections within the analog domain path from a control loop/path. A calibration process flow by the DPLL 108 can estimate the impairment in the digital domain path 116, and eliminate its source in the analog domain. For example, the correction can be done by changing the shaper bias point of the signal shaper component 104 sufficiently to compensate for any deterministic jitter that is generated by the doubler component 106 or along the reference path 112 based on the deterministic jitter estimations. This can enable the shaper 104 to set the duty cycle at the shaper's output to the value which produces zero deterministic jitter at the DPLL 108, offset the duty cycle to correct for the doubler component's effect on the deterministic jitter, and correct for phase drift/error that occurs between the signal components of the digital reference signal in the reference path 112. The duty cycle, for example, could be set to something that is not necessarily 50% due to the doubler 106 characteristics and other sources of bias, but could be something between 0% and 49% or 51% and less than 100%, for example.

Figure 2:
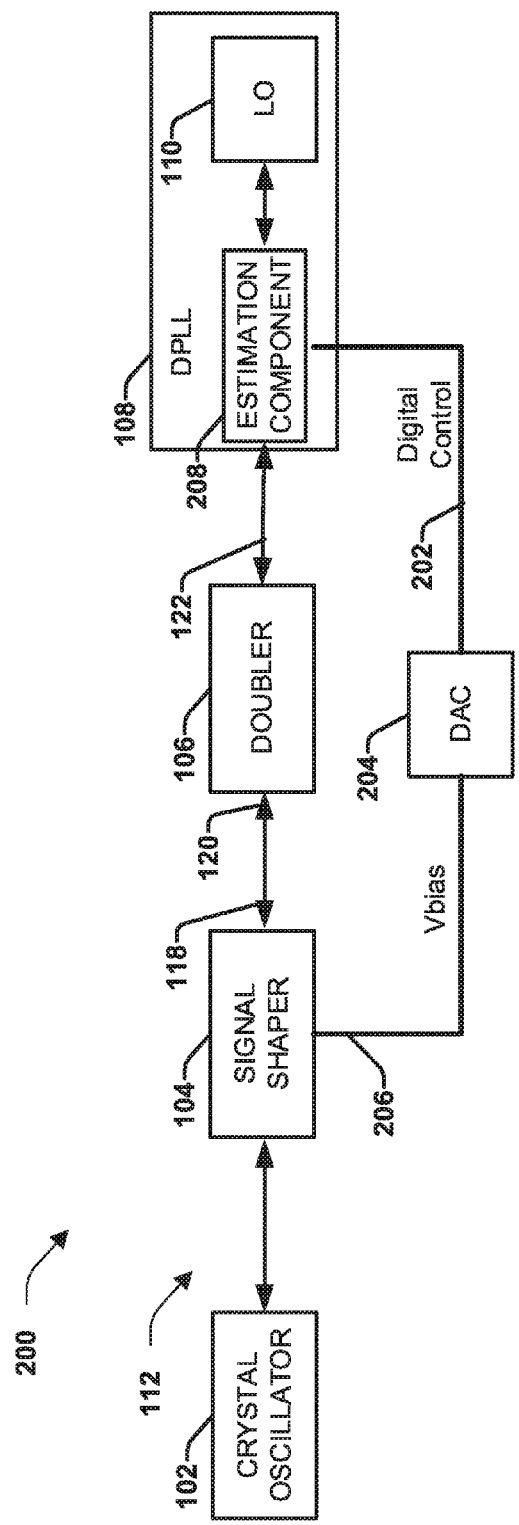
FIG. 2 illustrates another block diagram illustrating an example DPLL according to various aspects or embodiments.

Referring to FIG. 2, illustrated is an example DPLL system 200 that eliminates deterministic jitter via a closed loop or feedback path in a DPLL device. The doubler component output 122 can provide a signal (e.g., a digital reference signal) with an increased (e.g., approximately doubled) frequency from the signal output 118 by the signal shaper component 104 to the doubler input 120. An estimation component 208 of the DPLL 108 can receive the digital reference signal from the doubler output 122 and estimate/compare phases with respect to the oscillator signal of the LO 110. Based on the phases of the digital reference signal and a phase or cycle of the LO 110, the estimation component 208 can generate a correction signal. This correction can then be provided to a component (e.g., the signal shaper component 104) of the analog domain path of the reference path 112 to mitigate or eliminate deterministic jitter in the system 200.

In one example, the estimation component 208 can include a time-to-digital converter (TDC) that is configured to perform the one or more calibration processes by comparing the phases between signal components or edges of the digital reference signal based on a phase of the oscillator signal of the oscillator. 110 The estimation component 208 can then determine an amplitude/value of the deterministic jitter based on a degree of a difference (or offset) between these phases with respect to the VCO/LO cycle/period as a result of a phase drift or phase error from one or more sources along the reference path 112. This process flow or calibration can be performed by the estimation component 208 generating an estimation of the deterministic jitter and an amplitude value based on the estimations at a plurality of frequencies in order to compensate for, or take into account the integer ambiguity that contributes to deterministic jitter before an operational transmission mode or frequency locked state of the DPLL. The estimation component 208 then generates the correction signal, provides it to a digital analog converter (DAC) 204 as a feedback component along a control loop path/a feedback path 202, which can be fed-back in a closed loop to the shaper 104 at a supply bias terminal 206, for example.

The correction can be based on/a function of the amplitude of the deterministic jitter that is calculated from the estimations, and then converted into an analog bias by the DAC 204. The feedback path 202 then further provides the analog bias based on the amplitude of the deterministic jitter determined in the digital domain to the signal shaper component 206 in the analog domain, in which a DAC 204 converts a digital correction to an analog bias for the shaper based on the calibration or estimation processes in the DPLL 108.

The analog bias can be a voltage supply bias (Vbias) as an analog correction, for example, that modifies the duty cycle of the shaper 104 to alter the threshold and change the duty cycle based on an estimation of the deterministic jitter in the digital domain. As stated above, other components (as well as the doubler 106) can also contribute to determinist jitter or spurs, as well as components in the analog domain path (e.g., 114 of FIG. 1), and thus initial, as well as ongoing, calibration at calibration mode (boot up or power mode(s) or at manufacture) or at operational transmission mode for active transmission/reception of communication signals can be advantageous.

In one or more embodiments, the estimation component 208 can also be configured to determine a first deterministic jitter estimation and also a second deterministic jitter estimation at another frequency of the LO 110. Each deterministic jitter estimation can determine an amount of phase drift in the reference path signal components with a VCO/LO cycle, for example, and can be performed at different frequencies of the voltage controlled oscillator signal or the LO 110. These determinations/estimations can then be used to determine, estimate or check the amplitude value of the deterministic jitter.

For example, an amount of difference between the rising edges and the falling edges of the digital reference signal (as a duty cycle) can generate a deterministic jitter estimation at a first frequency between the digital reference signal and the LO signal, and then at another frequency, the same can also be determined to establish a degree of offset, which can then be used to derive an amplitude of the deterministic jitter or compared to one another to confirm they match. These measurements along different or a plurality of frequencies can confirm as well as make calculation of the deterministic jitter amplitude value for correction. The corrections would then be a function of the degree of offset determined from at least two different VCO/LO frequencies before an operational transmission mode or DPLL locked frequency mode or state. Additional calculations details are discussed below in the description of FIG. 4, for example.

In another embodiment, the estimation component 208 can determine the first and second deterministic jitter estimations at different frequencies of the oscillator signal during a calibration or in a boot-up phase of the DPLL 108 and before an operational transmission phase for online tracking, which is at/during transmission or reception of wireless signals at an antenna port once the DPLL 108 has been locked at a particular frequency. As used herein, "boot-up phase" can refer to the initialization or initial beginning of powering up a phase locked loop (e.g., the system 100, 200 or the DPLL 108), which is also considered a phase of operation before the phase locked loop is locked for an active operation. The active operation can be when a complete powering of the phase locked loop has occurred, in which active transmission or reception is enabled, or the DPLL has locked on a particular frequency or range of frequency for transmission or reception, for example.

For digital estimation in the digital domain, the estimation component 208 can estimate the deterministic jitter in the digital domain by one or more different processes for example by average phase errors over even and odd clocks separately, for example, at different VCO/LO frequencies. These estimations can be made at different frequencies (e.g., a first and a second frequency with about a 10% difference, or other percentage less than 100%). The estimation can then further be used in order to remove the spur(s) in the analog domain via the feedback/closed loop path 202 by controlling the duty cycle of downstream components (e.g., the shaper 104) in the analog domain.

The DPLL 108 can utilize the digital domain to measure the VCO (or LO) phase relative to the reference clock signal at 122 to measure the deterministic jitter and factor in the integer ambiguity as referred to herein before an operational transmission mode. Any deterministic jitter estimation can then utilize the VCO phase measurement, for example, in order to calculate the deterministic jitter amplitude. This limits the range of the impairment visibility to a VCO cycle. For example, if the VCO cycle time is 200 ps, there is no way to distinguish between deterministic jitter of 5p and of 205 ps, in which the VCO cycle is outside or under the VCO cycle (or integer/range of comparison/detection). This integer ambiguity can be (re-)solved by measuring DJ in multiple VCO frequencies during initial calibration or initial calibration/boot-up phases of the DPLL 108, and taking into account the VCO cycle or period. Thus, deterministic jitter from the doubler component 106 doubling the frequency (e.g., 40 MHz to 80 MHz) can be taken into account in the correction generated by the estimation of the estimation component 208.

Figure 3:
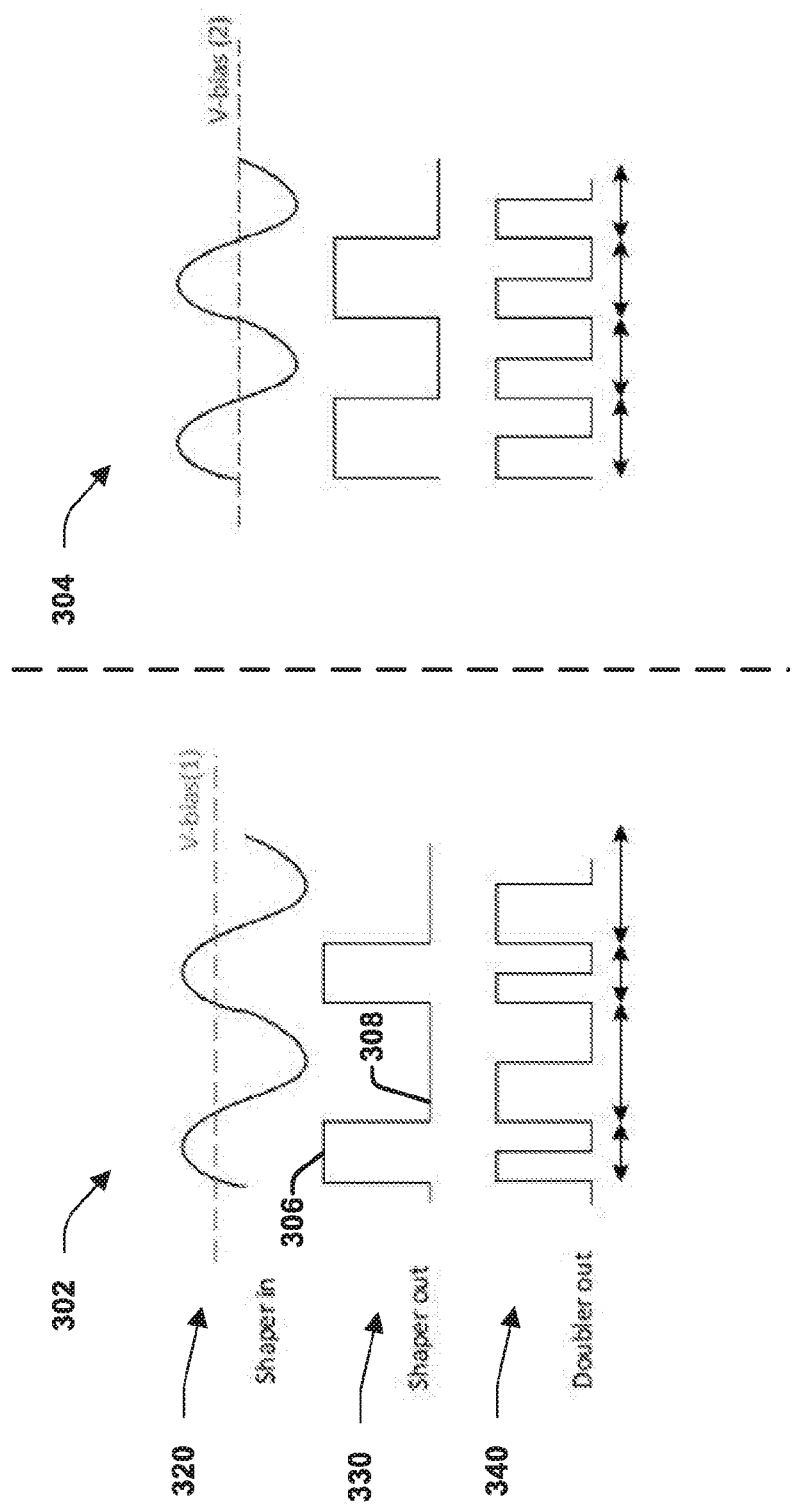
FIG. 3 illustrates an example of different signal stages of the DPLL systems according to various aspects or embodiments.

Referring now to FIG. 3, is an example of correction provided by the V-bias to mitigate the deterministic jitter of the systems being described in conjunction with FIGS. 1 and 2. The signals in the left column 302 represent signals at stages/components along the reference path 112 with a duty cycle. The signals in the right column 304 represent signals at stages/components along the reference path 112 without a duty cycle error.

Signals 320 of each column 302, 304 can represent analog signals in analog domain input to the signal shaper component 104 from the reference clock component 102 with and without a duty cycle error, which can be defined according to a threshold level such as the V-bias level. Signals 330 of each column 302, 304 can represent digital signals in the digital domain output by the signal shaper component 104 to the shaper output 118, for example, with and without a duty cycle. Signals 340 of each column 302, 304 can represent further digital signals in the digital domain output by the doubler component 106 and input to the DPLL 108 for processing by the estimation component 208.

The signal shaper component 104 can amplify/saturate/truncate sine signals to generate corresponding signals similar to a square wave. So below the threshold, for example, the voltage can be zero and above it one as a Vbias or voltage level bias, or some other level. If the threshold would be too high, in this example, the high level duration would be shorter than the low level as similar in the signals 320 in the column 302 for the digital signal. If the threshold is in the correct level, as in the right column, then duty cycle error can be non-existent or error free.

In an example, having a duty cycle at signals 302 can mean that instead of having a same time (e.g., 12.5 nanoseconds) between two edges in a 40 MHz clock cycle, a slightly different time value exists. For example, between a rising edge and a falling edge 306 the time can be about 12 nanoseconds, while between the falling edge and a rising edge 308 the time can be about 30 nanoseconds (or any other example time variance) so that the average could still be about 40 MHz for a given operational frequency cycle, even though such drift occurs. This phenomenon can be referred to as a "duty cycle error", where the differences (e.g., in length, time, or other property) between the rise and fall edges are not the same as between the fall and rise edges.

Further, after doubling the frequency at the doubler component 106, signals 340 with the new rising edges demonstrate a deterministic jitter, or a phase error, where one edge can be delayed, for example, by a half a nanosecond and the next one can be early by half a nanosecond, which can be referred to as the deterministic jitter. This is the deterministic jitter problem that can be eliminated by systems of a DPLL described herein and enable greater efficiency in power and communication as a result of the calibration processes for obtaining a correction.

Simply setting the Vbias to enable a zero duty cycle in the signal shaper component 104 does not necessarily eliminate the deterministic jitter that occurs in components upstream along the reference path 112 or that leaks to an antenna port affecting communications because various internal mechanisms can be a source of deterministic jitter also. This means that if there is some kind of internal determinant/source in the doubler component 106 or other source, for example, the duty cycle could be set (e.g., at the shaper 104 in the analog domain) by a correction of the threshold or duty cycle to be something other than zero, but could be slightly positive or negative in order to counter/correct for the internal effects caused by other components/operations (e.g., the doubler component 106) by a duty cycle offset. Thus, simply correcting for deterministic jitter completely in the analog solution by facilitating a zero duty cyclemerror, might not necessarily give a zero deterministic jitter.

Further, by compensating (canceling or providing a canceling signal) for the deterministic jitter and not correcting for it (adjusting a component operation) in the digital domain, also might not eliminate the deterministic jitter. As the DPLL 108 generates phase measurements, it can compare the LO phases of the LO 110 to the reference phases of a digital reference signal 122. The DPLL 108 compares the LO phase to the digital reference signal phase(s), and if the reference phase has the deterministic jitter, then it can be detected by the estimation component 208. The deterministic jitter can also be corrected in the digital domain with a compensation (e.g., an inverse signal, cancelation, or the like), but the output of the doubler component 106 or a leakage to the antenna port could still be present, such as leakage into the analog domain even though the DPLL countered for it. Thus, it can be advantageous to remedy the analog domain part with a Vbias based on estimations of the deterministic jitter in the digital domain.

Figure 4:
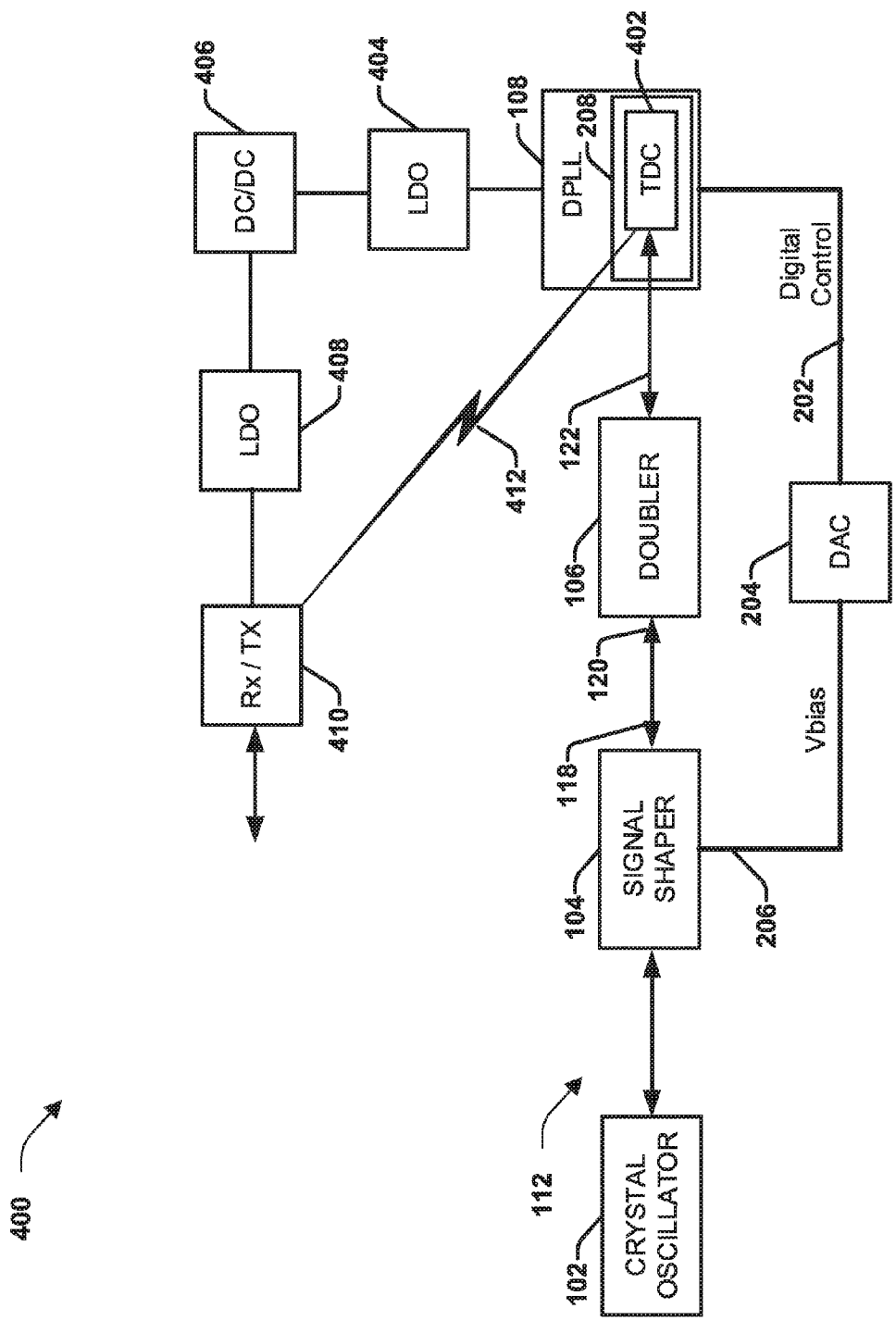
FIG. 4 illustrates another block diagram illustrating an example DPLL according to various aspects or embodiments.

Referring to FIG. 4, illustrated is another example system that can remove deterministic jitter according to various embodiments or aspects. The system 400, similar to the other systems described herein, can operate to improve the integrated phase noise of the DPLL 108 and eliminate unwanted spurs that might be an aggressor to a receiver/transmitter (RX/TX) 410. These systems can also enable reducing the power consumption of the reference path 112 by configuring single ended low power CMOS circuits. Because the DPLL is a key to the radio performance and has a large impact on signal to noise ratio (SNR)/EVM, improving the DPLL 108 in communication systems can be critical for improving communication and power efficiency.

As such, the system 400, for example, can correct deterministic jitter in the analog domain via the feedback/closed control loop 202, and perform an estimation of the deterministic jitter (e.g., an amplitude of the deterministic jitter) in the digital domain in order to facilitate an increase in SNR and lower the EVM. This can provide both the benefits of high resolution in the digital domain estimation plus include all the other determinants or source of deterministic jitter (e.g., the doubler component 106) in the estimation by the estimation component 208, which may not be possible to include or take into account in the analog domain alone.

In one example, the correction and estimation operations can be done at initial calibration at manufacture, or during a boot-up or powering phase before a locking phase/a locking of the DPLL 108 to a particular frequency during active transmission. Further, in case deterministic jitters results from temperature changes or other process variations (e.g., the shaper 104, doubler 106, or the crystal 102) from voltage, temperature or process variations over time, the control loop 202 can track the changes and correct for them upon detection at the estimation component 208 in operational transmission in the field.

The system 400 illustrates the leakage 412, resulting from the deterministic jitter experienced at the TDC 402. The TDC 402 included as part of the estimation component 208 can perform one or more calibration processes by comparing phases between the digital reference signal and the oscillator signal (e.g., VCO signal) of the oscillator. Various other components, including low drop out regulators 404 and 408 and the direct current-to-direct current (DC-to-DC) converter 406, can also be present within the transmission/reception paths, as well as other components of the system 400. The LDOs 404 and 408 can serve to regulate a DC voltage output from the DPLL 108 as well as the DC to DC converter 406, changing an amplitude of the DC signal.

The TDC 108 can determine an amplitude of the deterministic jitter based on a degree of a difference between the phases, at a plurality of frequencies, and generating the analog bias based on the amplitude of the deterministic jitter. As such, the estimation component 208 is further configured to estimate the deterministic jitter based on an integer ambiguity, which is a function of a phase drift between the digital reference signal and an oscillator signal of a voltage controlled oscillator.

For example, the estimation component 208 with the TDC 402 can estimate a first deterministic jitter based on phases of the digital reference signal and the oscillator signal, and a second deterministic jitter based on phases between the digital reference signal and the oscillator signal, in which each estimation can be at a different frequency of the voltage controlled oscillator signal or the LO. This can provide additional data to determine the phase drift or the amount of integer ambiguity. An average phase drift or a degree of phase drift can thus be determined, for example, for generating a digital bias signal along the feedback path 202, which feeds into the DAC 204 as a control loop component for generating/providing an analog bias to the shaper through a control loop of a feedback path.

The estimation component 208 is further configured to eliminate odd signal harmonic spurs that cause leak to the antenna port as the leakage 412 by eliminating the deterministic jitter resulting from the doubler component 106 along the reference path 112 in the analog domain. As such, the deterministic jitter can be corrected for by adjusting a previous component (e.g., shaper 104) upstream of the doubler component 106 and the duty cycle associated with it.

The DPLL 108 in digital domain measures the VCO phase relative to the reference clock of the reference/crystal 102 with the TDC 402. A deterministic jitter estimation by the DPLL 108 can use the VCO phase/cycle in order to calculate the deterministic jitter amplitude. This can limit the range of the impairment visibility to that of a VCO cycle or range of the VCO in a period. For example, if the VCO cycle time is about 200 ps, distinguishing between deterministic jitter and a 5 ps offset (under or under within the VCO cycle) and an amplitude (e.g., 205 ps) could be difficult because 200 ps is the observable integer or range of a given cycle. This ambiguity or integer ambiguity, as it is referred to herein, however can be solved by measuring/estimating deterministic jitter in multiple VCO frequencies and factoring into the estimation any phase drift.

In an aspect, these phase measurements at different frequencies can be made during an initial calibration, such as at manufacturing or before an active transmission via the antenna port or communication component 410 of operation in the field (e.g., at initial boot-up/powering or before operational transmission the field where the DPLL 108 becomes frequency locked for wireless transmission to occur), while additional embodiments can include online tracking in an operational transmission mode or after frequency locking of the DPLL in the field. The following equations can represent the estimation operations:

$$\hat{D}J_1 = \mathrm{mod}(DJ, T_{c1}); T_{c1} \triangleq \frac{1}{f_{c1}};$$

$$\hat{D}J_2 = \mathrm{mod}(DJ, T_{c2}); T_{c2} \triangleq \frac{1}{f_{c2}};$$

$$DJ = \hat{D}J_1 + K \cdot T_{c1} = \hat{D}J_2 + K \cdot T_{c2};$$

where K is a constant common for both frequencies of the LO/VCO (e.g., LO 110) as long as these frequencies are not extremely far apart or greater than the span of the LO/VCO cycle. $\hat{D}J_1$ can be the deterministic jitter measured or estimated at a first frequency along a first period of time (or a period of a frequency carrier ($f_c$) based on or as a function of a modulo function or modulo operator (e.g., $\mathrm{mod}(DJ, T_{c1})$), and $\hat{D}J_2$ can be the deterministic jitter measured or estimated at a second, different frequency based on, or as a function of a modulo function/operator at a different LO/VCO frequency. The DJ of these representations or equations can be a measured value. The amplitude of the deterministic jitter can then be determined/estimated by taking into account operations at different frequencies with these mathematical representations. Additional wrap-around or overlapping of additional cycles can also be easily detected and accounted for. The estimation of K can also be improved by utilizing multiple or two or more different frequencies, as shown by the following representation:

$$\hat{K} = \mathrm{Round}\left(\frac{\hat{D}J_2 - \hat{D}J_1}{T_{c1} - T_{c2}}\right),$$

where a rounding up can be performed.

Accordingly, the systems described herein can provide for the DPLL 108 to generate calibration processes for the initial calibration and in the field for ongoing online tracking (in operation mode) of deterministic jitter and elimination of leakage 412 to the antenna port/receiver/transmitter 410. In order to track the deterministic jitter in the operational mode in the field or during active transmission modes, an initial estimation and correction can be first generated as discussed herein to accommodate or avoid the ambiguity problem during a later operational mode (where the frequency is unable to be altered).

During operational mode of the DPLL 108 or system 400, the deterministic jitter impairment can change due to temperature drift, process or voltage variations, for example. Therefore, online estimation and correction can be utilized as part of an online tracking for removing deterministic jitter/leakage. The feedback signal from the estimation (e.g., digital control signal for a digital bias) can provide a control loop path 202 to keep the deterministic jitter low or near zero. Regarding the integer ambiguity problem, the change in deterministic jitter due to temperature is likely not large enough to re-introduce ambiguity (after being corrected in the initial stage or calibration processes at start-up/boot-up/power/manufacture).

When trying to estimate the deterministic jitter in the digital domain, the phase measurements can be analyzed or examined or measured. The TDC 402 can measure the phase difference between the VCO/LO (e.g., 110) components with the reference clock 102. For example, the reference clock can be 40 MHz and the VCO about 4 GHz. Thus, each cycle of a reference clock 102 could be 100 cycles of LO clock. With the doubler 106, then it could be 50 cycles, because the frequency is doubled and sampled at every 80 MHz, for example. If sampled every 80 MHz, instead of sampling every 12.5 nanoseconds (ns), a deterministic jitter of half a nanosecond could exist, then sampling at every 12 ns and every 30 ns could be performed. If sampling a 4 GHz clock with a 80 MHz clock, then an expectation is to observe the same phase because an integer number of cycles would exist within one reference cycle or period. With integer ambiguity, instead of a 4 GHz LO clock, a 4.1 GHz could exist where the phase will shift, and then the estimation component 208 could calculate how much within one cycle the signals will phase shift. If there is a 1 picosecond deterministic jitter (e.g., 1 ps), this means that the phase observed will show that in the even clock it will be slightly smaller and in the odd clock slightly larger in comparison. Then an offset will show about 1 ps off, where for 4 GHz, it is about a ten degree difference, or slightly less. Regardless, a shift of a few degrees to the left and to the right can be observed. The amount can then be determined from the amount of shift, from those ten degrees, for example, because the estimation component 208 can know that ten degrees is a percentage of the cycle (e.g., the VCO/LO cycle).

If the same deterministic jitter is measured with different frequencies, then a calculation of the right deterministic jitter can be made. For example, if the deterministic jitter is about 255 ps, for example, then if 4 GHz is generated, which could be a 250 cycle, a 5 ps will be determined. If the LO cycle is increased to 260 ps, then a minus five is determined, and if you use 270, then you will see minus 15. In this case, the difference between 5 and 255 can be determined, because if it were five then in all the three cases five ps each time will be determined because each time the modulo operation is performed the difference can be determined if the period is different.

While the methods described within this disclosure are illustrated in and described herein as a series of acts or events, it will be appreciated that the illustrated ordering of such acts or events are not to be interpreted in a limiting sense. For example, some acts may occur in different orders or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

Figure 5:
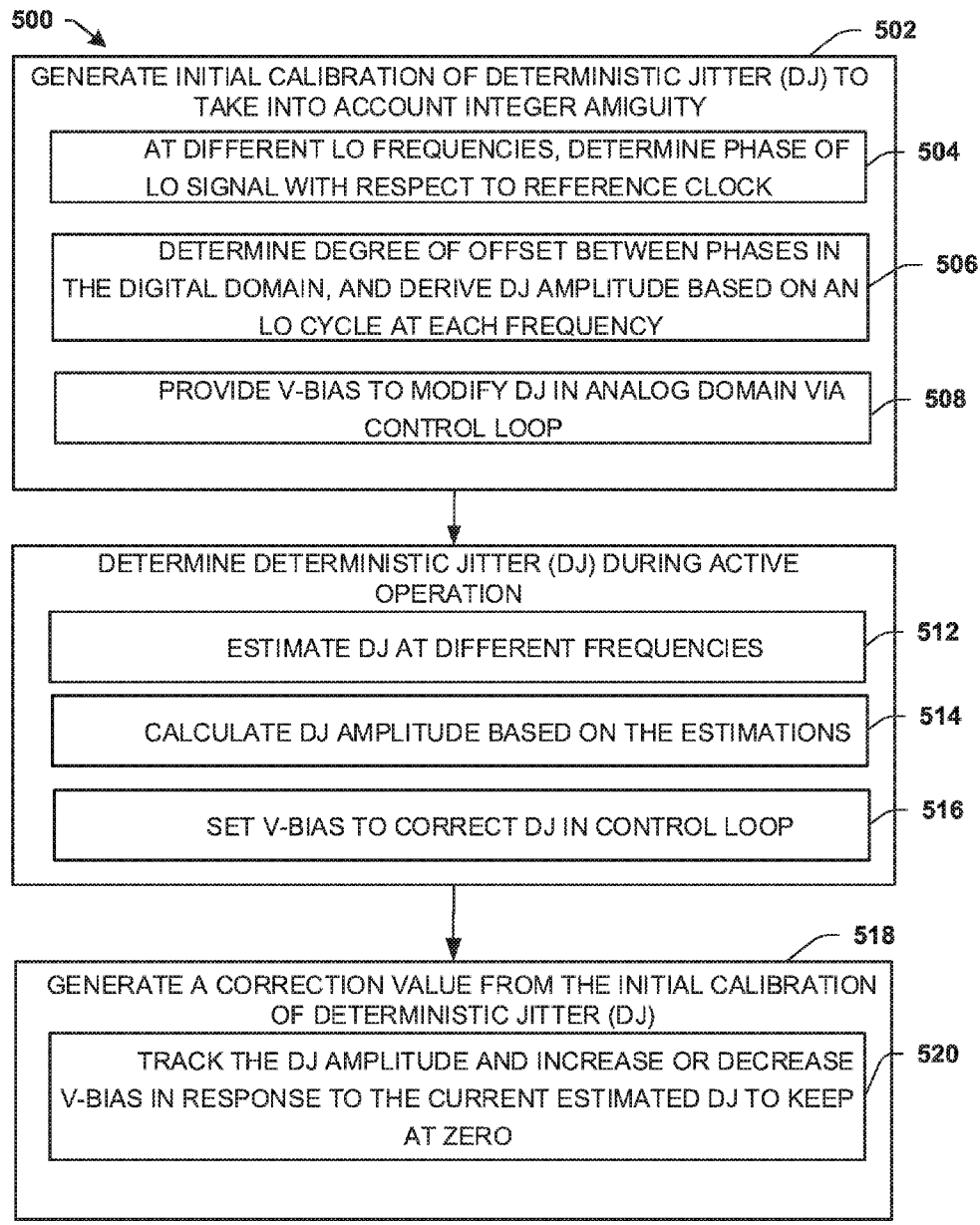
FIG. 5 illustrates an example process flow for removing deterministic jitter in DPLL systems according to various aspects or embodiments.

Referring to FIG. 5, illustrated is an example process flow 500 for correcting the deterministic jitter in a DPLL system as part of initial calibration before active transmission to eliminate integer ambiguity from the doubler component 106, for example, and for online tracking in an operational mode. During operational mode the deterministic jitter (DJ) impairment can change due to temperature drift or other variations. Therefore, online estimation and correction can be utilized also, as demonstrated in the process flow after initial calibration processes at 510. Thus, the feedback (e.g., 202) can provide a control loop to keep the DJ low or near zero both during calibration and then dynamically in an active mode by the processes or operations of process flow 500.

During calibration mode (e.g., a sleep mode, low power mode, etc.), or before an operational mode where the DPLL is locked and transmission/reception can occur, at 502 the DJ can be estimated to take into account or resolve integer ambiguity, which can result from a component in the digital domain (e.g., a doubler component 106). At 502, estimation or determination is generated of a phase of the LO signal with respect to a reference clock (e.g., digital reference signal). A determination of phases of the LO signal with respect to the reference clock signal (digital reference signal) can be made at different LO frequencies. At 504, the digital reference signal (or reference clock signal doubled within the digital domain to the DPLL) can be analyzed (e.g., by estimation component 208) with the LO signal. At 506, the phase or phases of these signals can be analyzed to determine a offset between adjacent edges of the digital reference signal at the doubler output 122 to estimate the deterministic jitter at each frequency of the LO (e.g., 110). From this degree of drift/shift, the DJ amplitude can be derived according to an LO cycle at each frequency and an amount of offset that occurs with the reference clock within the LO cycle as an amount of integer ambiguity that can be used to generate a correction for the duty cycle at the shaper 104. Here, the modulo functions, discussed above, can be used at each frequency on the estimated deterministic jitter amplitudes/values for comparison or determining the DJ. At 508, a V-bias amplitude can be generated from a digital correction signal based on the estimation of the DJ in the digital domain. The V-bias can be a voltage bias signal that is in the analog domain for modifying the shaper 104 threshold in a closed loop and adjusting the level of the duty cycle between different edges in the digital reference signal to the DPLL 108.

At 512-516, the DJ can further account for in the field (or working conditions), and tracked during an operational transmission mode. Regarding the ambiguity problem, the change in DJ due to temperature is not large enough to re-introduce or take into account the integer ambiguity (after it was corrected in the initial/calibration stage). As such, the process flow 500 for calibration processes for online tracking can continue, including: a) estimating, at 512, deterministic jitter in 2 (or more) different VCO/LO frequencies (e.g., two frequencies with about a 10% difference, or other difference that is less than about 100%), then at 514, b) using the estimations to calculate the "un-wrapped" DJ amplitude or the deterministic jitter at each frequency before performing the modulo function or operations to determine $\hat{DJ}_1$ and $\hat{DJ}_2$ as demonstrated above, and then c) setting, at 516, the V-bias at the signal shaper component 104 to correct the DJ (closed-loop correction), which can be at least partially generated by internal mechanisms of the doubler component 106, for example, or result from the component itself being attached in-line of the reference path 112 in the digital domain.

Once transmitting or receiving a packet in operation mode, the DPLL 108 or system 400, for example, cannot just simply change the frequency, so in order to do this initial calibration to estimate the ambiguity, an initial measurement/initial curve/initial assessment can be performed just to understand where the deterministic jitter stands or may be around during an active transmission. Further, once there is compensation for the tracking and when only left with a small deterministic jitter, then the estimation component 208, for example, can start with the tracking and perform it in online (operational transmission/frequency locked) mode. During the transmission or reception, the system can estimate the residual deterministic jitter on the fly, and correct it to keep it around a target or at about zero.

The process flow can then continue at 518 with an online tracking to start with providing/generating a correction value in analog from the digital signal for the V-bias found in the calibration stage for operational mode tracking, beginning from the act 512-. At 520, the process flow comprises tracking the DJ amplitude, and increasing or decreasing the V-bias value according to the current estimated DJ (keeping it around zero), which a current iteration can be based on a previous iteration of estimation. The estimation component is further configured to generate an adjustment of the analog bias by tracking one or more amplitudes of the deterministic jitter during the locking phase of operation comprising transmitting or receiving the wireless signals at the antenna port and generating a second analog bias based on the adjustment to keep further estimations of the deterministic jitter at about zero.

Figure 6:
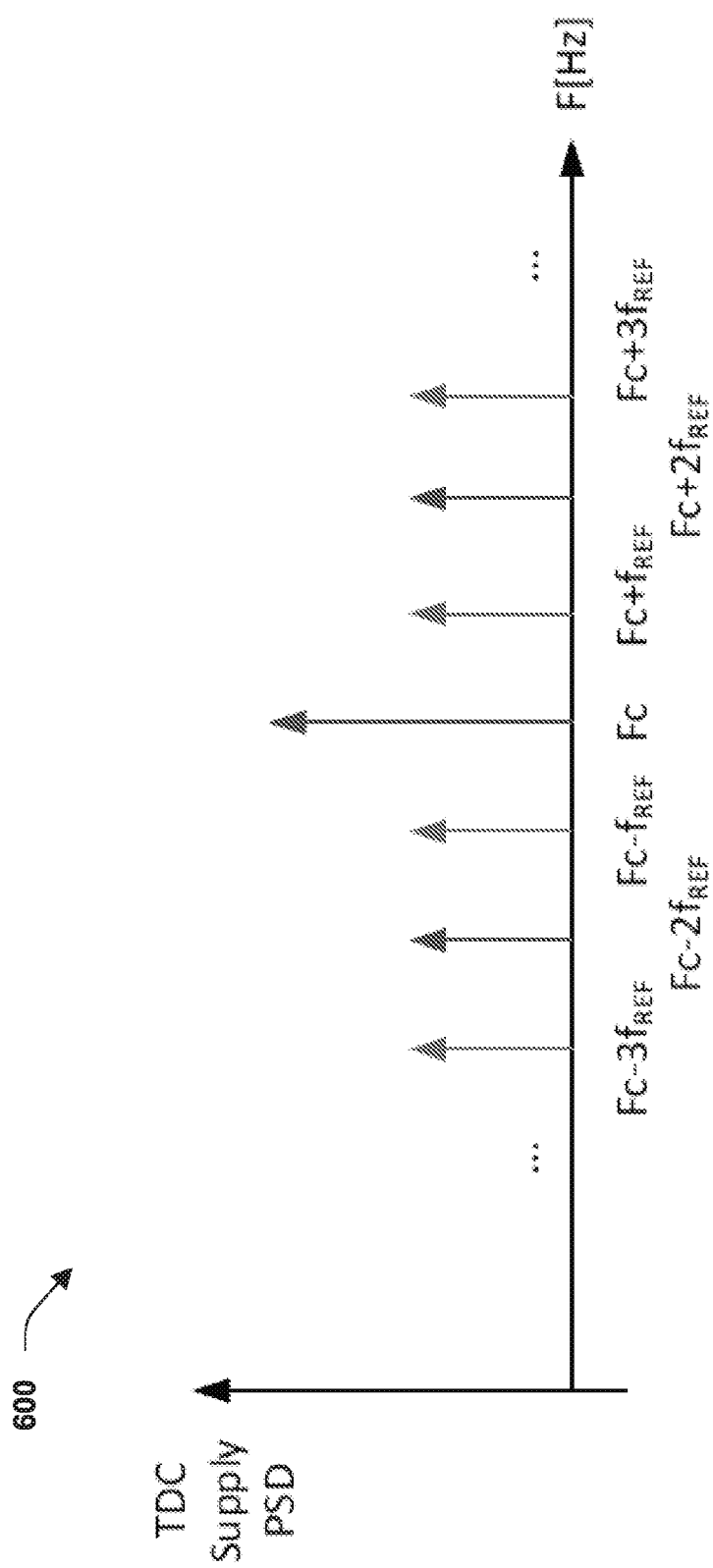
FIG. 6 illustrates an example of even and odd harmonics of deterministic jitter or the leakage deriving there-form according to various aspects or embodiments.

Referring now to FIG. 6, illustrated is an example of the leakage 412, which can comprise, consist of, or be caused by the deterministic jitter at the DPLL 108 or the digital reference signal along the reference path 112 or digital domain portion 116 from the output 122 of the doubler 106 to the DPLL 108. The leakage/deterministic jitter components 412 can include both odd and even harmonic spurs that couple to the receiver/transmitter/antenna port 410 of FIG. 4. These harmonic components are illustrated in the TDC supply power spectral density (PSD), for example, mapped over the frequency in Hertz.

One of the major impacts of deterministic jitter can be on odd reference harmonic spurs coupled to component 410. The coupling/leakage 412 can be caused by several mechanisms like supply coupling, or substrate coupling, as well as other sources/mechanisms. Because the TDC sampling rate of the TDC 402 is the doubled clock deriving from the doubled frequency of the digital reference signal from the doubler 106, the deterministic jitter will cause odd harmonics in its supply signals to the Rx/Tx/antenna port (modulated with the LO). These harmonics can be coupled to Rx and degrade its EVM, and sensitivity, for example.

Figure 7:
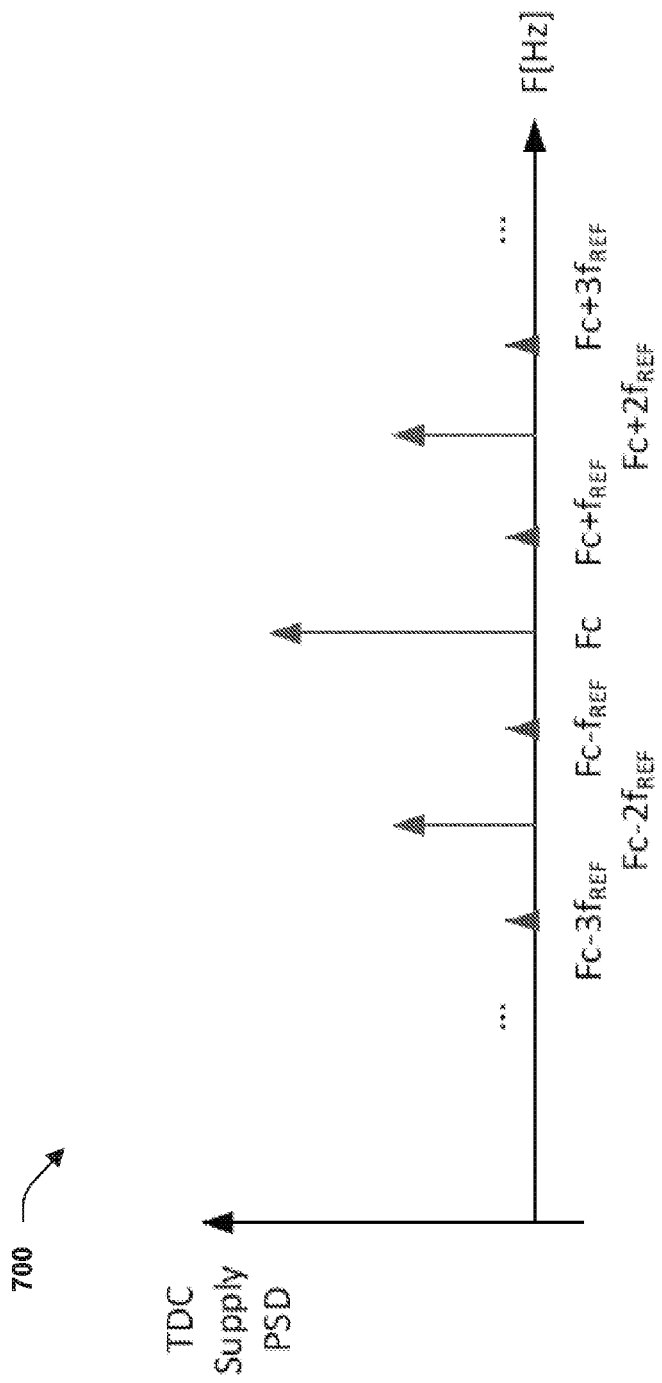
FIG. 7 illustrates an example of removal of the deterministic jitter according to various aspects or embodiments.

Referring to FIG. 7, illustrates an example of the PSD over frequency of the TDC supply signal where the deterministic jitter has been removed and the doubler component 106 is no longer a source affecting the supply after modulation by the LO to the transmitter/receiver 410. The odd harmonics at the TDC or in the digital reference signal from the doubler component 106 have been removed by the generation of a bias based on the estimation or calibration processes to the shaper 104 along the feedback path 202 and digital to analog converter 204.

Figure 8:
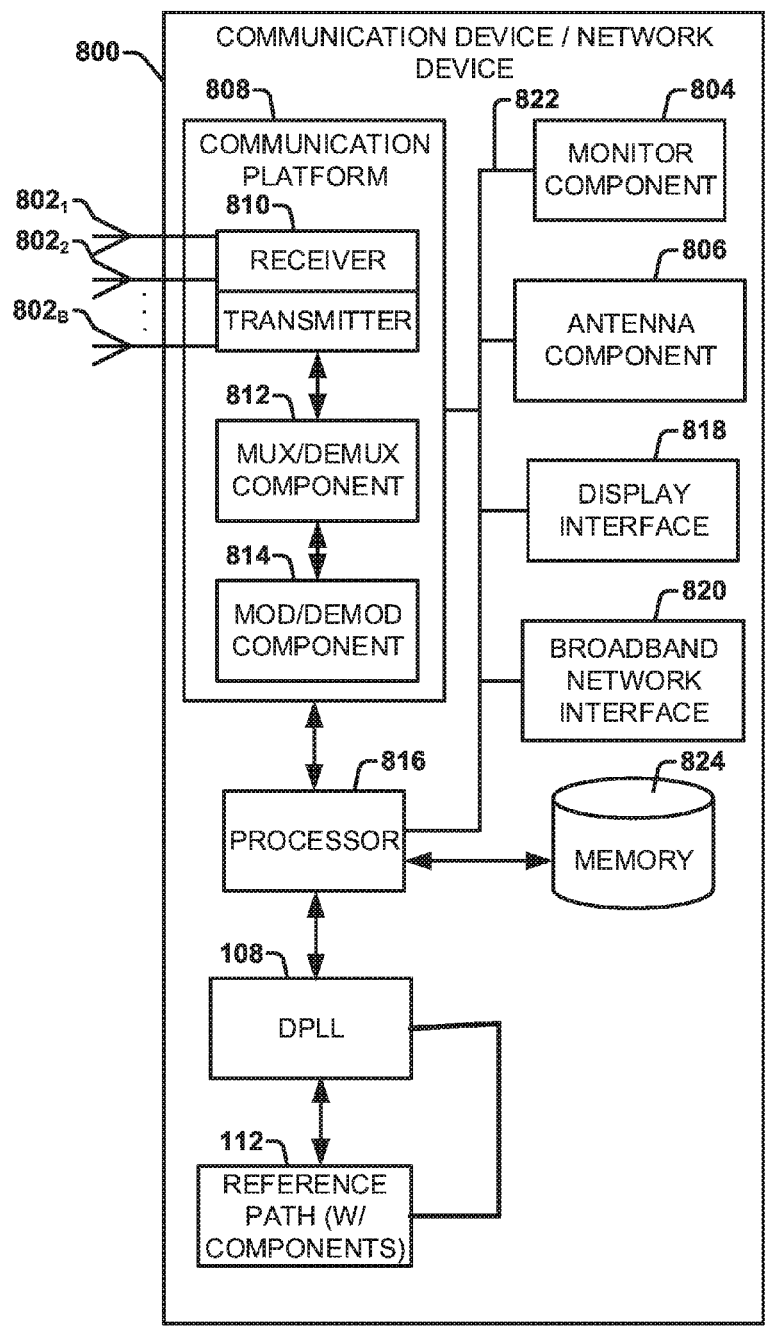
FIG. 8 illustrates an example mobile device with a DPLL system for eliminating deterministic jitter according to various aspects or embodiments.

FIG. 8 further illustrates an embodiment of a network device or system 800 to be employed in an eNB, a UE or other network device that facilitates or enables signaling mechanisms to process or provide signaling according to various aspects herein for correcting or eliminating deterministic jitter, as well as reduce resulting leakage to an antenna port. System or device 800 can include a baseband circuitry, a radio frequency (RF) circuitry, or a front end module circuitry, as well as communication component or platform 808 with transmitter circuitry component(s)/receiver circuitry 810 (e.g., a communication component), a processor 816, memory 824, the DPLL 108 and reference path 112 including other components, devices, systems or embodiments being described herein.

In various aspects, device 800 can be included within an Evolved Universal Terrestrial Radio Access Network (E-UTRAN) Node B (Evolved Node B, eNodeB, or eNB 102), other base station, network access point, a secondary cell network device (e.g., a small cell, or WiFi network device) or other cell network component/device in a wireless communications network. Memory 824 also can include instructions that can be implemented by processor 816, transmitter circuitry 810, or receiver circuitry 810 to implement various aspects or embodiments described herein.

Memory 824 can comprise one or more machine-readable medium/media including instructions that, when performed by a machine or component herein cause the machine to perform acts of the method or of an apparatus or system for concurrent communication using multiple communication technologies according to embodiments and examples described herein. It is to be understood that aspects described herein can be implemented by hardware, software, firmware, or any combination thereof. When implemented in software, functions can be stored on or transmitted over as one or more instructions or code on a computer-readable medium (e.g., the memory described herein or other storage device). Computer-readable media includes both computer storage media and communication media including any medium that facilitates transfer of a computer program from one place to another. A storage media or a computer readable storage device can be any available media that can be accessed by a general purpose or special purpose computer. By way of example, and not limitation, such computer-readable media can comprise RAM, ROM, EEPROM, CD-ROM or other optical disk storage, magnetic disk storage or other magnetic storage devices, or other tangible and/or non-transitory medium, that can be used to carry or store desired information or executable instructions. Also, any connection is properly termed a computer-readable medium. For example, if software is transmitted from a website, server, or other remote source using a coaxial cable, fiber optic cable, twisted pair, digital subscriber line (DSL), or wireless technologies such as infrared, radio, and microwave, then coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

Access equipment (e.g., eNB, network entity, or the like), UE or software related to access of the network device 800 can receive and transmit signal(s) from and to wireless devices, wireless ports, wireless routers, etc. through segments $802_1$-$802_B$ (B is a positive integer). Segments $802_1$-$802_B$ can be internal and/or external to access equipment and/or software related to access of a network, and can be controlled by a monitor component 804 and an antenna component 806. Monitor component 804 and antenna component 806 can couple to communication component 808, which can include electronic components and associated circuitry that provide for processing and manipulation of received signal(s) and other signal(s) to be transmitted.

In an aspect, communication component 808 includes the receiver/transmitter 810 that can convert analog signals to digital signals upon reception of the analog signals, and can convert digital signals to analog signals upon transmission. In addition, receiver/transmitter 810 can divide a single data stream into multiple, parallel data streams, or perform the reciprocal operation. Coupled to receiver/transmitter 810 can be a multiplexer/demultiplexer 812 that can facilitate manipulation of signals in time and frequency space. Multiplexer/demultiplexer 812 can multiplex information (data/traffic and control/signaling) according to various multiplexing schemes such as time division multiplexing, frequency division multiplexing, orthogonal frequency division multiplexing, code division multiplexing, space division multiplexing. In addition, multiplexer/demultiplexer component 812 can scramble and spread information (e.g., codes, according to substantially any code known in the art, such as Hadamard-Walsh codes, Baker codes, Kasami codes, polyphase codes, and so forth).

A modulator/demodulator 814 can also be a part of communication component/platform 808, and can modulate information according to multiple modulation techniques, such as frequency modulation, amplitude modulation (e.g., M-ary quadrature amplitude modulation, with M a positive integer); phase-shift keying; and so forth).

Access equipment or software related to access of a network also includes a processor 816 (or processor component) configured to confer, at least in part, functionality to substantially any electronic component in access equipment/ software. In particular, processor 816 can facilitate configuration of access equipment and/or software through, for example, monitor component 804, antenna component 806, and one or more components therein. Additionally, access equipment and/or software can include display interface 818, which can display functions that control functionality of access equipment and/or software or reveal operation conditions thereof. In addition, display interface 818 can include a screen to convey information to an end user. In an aspect, display interface 818 can be a liquid crystal display, a plasma panel, a monolithic thin-film based electrochromic display, and so on. Moreover, display interface 818 can include a component (e.g., speaker) that facilitates communication of aural indicia, which can also be employed in connection with messages that convey operational instructions to an end user. Display interface 818 can also facilitate data entry (e.g., through a linked keypad or through touch gestures), which can cause access equipment and/or software to receive external commands (e.g., restart operation).

Broadband network interface 820 facilitates connection of access equipment or software to a service provider network (not shown) that can include one or more cellular technologies (e.g., third generation partnership project universal mobile telecommunication system, global system for mobile communication, and so on) through backhaul link(s) (not shown), which enable incoming and outgoing data flow. Broadband network interface 820 can be internal or external to access equipment and/or software and can utilize display interface 818 for end-user interaction and status information delivery.

Processor 816 can be functionally connected to communication platform 808 and can facilitate operations on data (e.g., symbols, bits, or chips) for multiplexing/multiplexing, such as enabling direct and inverse fast Fourier transforms, selection of modulation rates, selection of data packet formats, inter-packet times, and so on. Moreover, processor 816 can be functionally connected, through data, system, or an address bus 822, to display interface 818 and broadband network interface 820, to confer, at least in part, functionality to each of such components.

In access equipment and/or software memory 824 can retain location and/or coverage area (e.g., macro sector, identifier(s)) access list(s) that authorize access to wireless coverage through access equipment and/or software sector intelligence that can include ranking of coverage areas in the wireless environment of access equipment and/or software, radio link quality and strength associated therewith, or the like. Memory 824 also can store data structures, code instructions and program modules, system or device information, code sequences for scrambling, spreading and pilot transmission, access point configuration, and so on. Processor 816 can be coupled (e.g., through a memory bus), to memory 824 in order to store and retrieve information used to operate and/or confer functionality to the components, platform, and interface that reside within access equipment and/or software.

The network device 800, system, component or device herein can be incorporated into or otherwise part of, an eNB, a UE, or some other type of electronic device in accordance with various embodiments. Specifically, the electronic device or components or interfaces described herein can be logic and/or circuitry that can be at least partially implemented in one or more of hardware, software, or firmware. In some embodiments, the electronic device logic can include radio transmit logic and receive logic (e.g., 810) coupled to control logic (e.g., processor 816). Additionally or alternatively, transmit/receive logic can comprise elements or modules of transceiver logic 810. The electronic device, component(s), circuitry or interfaces of such electronic device can be configured to perform operations similar to those described elsewhere in this disclosure.

As used herein, the term "circuitry" may refer to, be part of, or include an Application Specific Integrated Circuit (ASIC), an electronic circuit, a processor (shared, dedicated, or group), and/or memory) shared, dedicated, or group (that execute one or more software or firmware programs, a combinational logic circuit, and/or other suitable hardware components that provide the described functionality. In some embodiments, the circuitry may be implemented in, or functions associated with the circuitry may be implemented by, one or more software or firmware modules. In some embodiments, circuitry may include logic, at least partially operable in hardware.

As it employed in the subject specification, the term "processor" can refer to substantially any computing processing unit or device including, but not limited to including, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit, a digital signal processor, a field programmable gate array, a programmable logic controller, a complex programmable logic device, a discrete gate or transistor logic, discrete hardware components, or any combination thereof designed to perform the functions and/or processes described herein. Processors can exploit nano-scale architectures such as, but not limited to, molecular and quantum-dot based transistors, switches and gates, in order to optimize space usage or enhance performance of mobile devices. A processor may also be implemented as a combination of computing processing units.

In the subject specification, terms such as "store," "data store," "data storage," "database," and substantially any other information storage component relevant to operation and functionality of a component and/or process, refer to "memory components," or entities embodied in a "memory," or components including the memory. It is noted that the memory components described herein can be either volatile memory or nonvolatile memory, or can include both volatile and nonvolatile memory.

By way of illustration, and not limitation, nonvolatile memory, for example, can be included in a memory, nonvolatile memory (see below), disk storage (see below), and memory storage (see below). Further, nonvolatile memory can be included in read only memory, programmable read only memory, electrically programmable read only memory, electrically erasable programmable read only memory, or flash memory. Volatile memory can include random access memory, which acts as external cache memory. By way of illustration and not limitation, random access memory is available in many forms such as synchronous random access memory, dynamic random access memory, synchronous dynamic random access memory, double data rate synchronous dynamic random access memory, enhanced synchronous dynamic random access memory, Synchlink dynamic random access memory, and direct Rambus random access memory. Additionally, the disclosed memory components of systems or methods herein are intended to include, without being limited to including, these and any other suitable types of memory.

Examples can include subject matter such as a method, means for performing acts or blocks of the method, at least one machine-readable medium including instructions that, when performed by a machine cause the machine to perform acts of the method or of an apparatus or system for concurrent communication using multiple communication technologies according to embodiments and examples described herein.

Example 1 is an apparatus employed in a mobile device with a digital phase locked loop comprising: a reference clock component comprising a crystal configured to provide an analog reference signal to a reference path in an analog domain; a signal shaper component configured to shape the analog reference signal into a square signal, and provide the square signal in a digital domain to a shaper output of the reference path; a doubler component configured to approximately double the square signal to generate a digital reference signal, and provide the digital reference signal at a doubler output of the reference path to estimate of deterministic jitter based on a local oscillator signal of a local oscillator and the digital reference signal; and a control loop coupling a digital domain portion of the reference path to an analog domain portion of the reference path with a feedback path to provide an analog bias signal in the analog domain to the shaper, and eliminate the deterministic jitter in the digital domain with the analog bias signal.

Example 2 includes the subject matter of Example 1, further comprising: an estimation component configured to generate an estimation of the deterministic jitter, generate a digital correction based on the estimation, and provide the digital correction to the feedback path to correct a duty cycle at the shaper output of the signal shaper component with the analog bias signal based on the digital correction.

Example 3 includes the subject matter of any one of Examples 1-2, including or omitting any elements as optional, wherein the estimation component is further configured to modify the duty cycle of the shaper to be less than about 50% and greater than about 0%, or greater than about 50% and less than about 100% based on the digital correction.

Example 4 includes the subject matter of any one of Examples 1-3, including or omitting any elements as optional, wherein the estimation component is further configured to estimate the deterministic jitter at the doubler output based on an integer ambiguity in phase cycles between the digital reference signal and the local oscillator signal, at different frequency levels of the local oscillator.

Example 5 includes the subject matter of any one of Examples 1-4, including or omitting any elements as optional, wherein the estimation component is further configured to eliminate a leakage of odd signal harmonics at an antenna port coupled that is coupled to the DPLL.

Example 6 includes the subject matter of any one of Examples 1-5, including or omitting any elements as optional, wherein the estimation component is further configured to generate the digital correction during a boot phase or an initial calibration phase of the digital phase lock loop that is before an operational transmission phase for transmission or reception of wireless signals, and generate an adjustment to the analog bias signal by tracking one or more amplitudes of the deterministic jitter during an operational transmission phase to generate a second digital correction based on the adjustment to keep further estimations of the deterministic jitter at about zero during the transmission or reception.

Example 7 includes the subject matter of any one of Examples 1-6, including or omitting any elements as optional, further comprising: a time to digital converter (TDC) configured to compare phases of the digital reference signal and the local oscillator signal of the local oscillator, at different frequencies of the local oscillator; and an estimation component configured to determine an amplitude of the deterministic jitter based on a degree of a difference between the phases, and generate the digital correction to the feedback path; wherein the control loop comprises a digital-to-analog converter configured to generate the analog bias signal based on the digital correction to correct for an integer ambiguity based on the degree of the difference.

Example 8 includes the subject matter of any one of Examples 1-7, including or omitting any elements as optional, wherein the doubler component is further configured to generate at least a part of the deterministic jitter at the doubler output.

Example 9 is a system for a digital phase locked loop comprising: a crystal oscillator coupled to a signal shaper component, wherein the signal shaper component is configured to provide a square wave at a shaper output based on an analog signal from the crystal oscillator in an analog domain along an analog portion of a reference signal path; a doubler component, coupled to the signal shaper component downstream of the reference signal path, configured to provide a digital reference signal to a doubler output in a digital domain along a digital portion of the reference signal path to the DPLL by approximately doubling a square wave frequency of the square wave; and an estimation component configured to generate an estimation of a deterministic jitter in the digital domain and provide a digital correction that is based on the estimation in the digital domain to a feedback path; a control loop coupling the feedback path to the digital phase locked loop and to the signal shaper component, configured to provide an analog bias to the signal shaper component in the analog domain based on the digital correction from the estimation of the deterministic jitter in the digital domain, and eliminate the deterministic jitter at the doubler output with the analog bias in the analog domain.

Example 10 includes the subject matter of Example 9, including or omitting any elements as optional, wherein a digital-to-analog converter of the control loop is configured to adjust a duty cycle at the shaper output of the signal shaper component and eliminate the deterministic jitter that is estimated in the digital domain by providing the analog bias to the signal shaper component in the analog domain.

Example 11 includes the subject matter of any one of Examples 9-10, including or omitting any elements as optional, wherein the estimation component is further configured to generate the estimation of the deterministic jitter based on one or more calibration processes that factor an integer ambiguity in phase measurements of the digital reference signal and of an oscillator signal from an oscillator, and further calibrate the signal shaper component with a voltage bias signal as the analog bias.

Example 12 includes the subject matter of any one of Examples 9-11, including or omitting any elements as optional, wherein the estimation component comprises a time-to-digital converter (TDC) configured to perform the one or more calibration processes by comparing phases of the digital reference signal based on the oscillator signal of the oscillator, determining an amplitude of the deterministic jitter based on an offset between the phases of the digital reference signal and a cycle of the oscillator signal, at a plurality of frequencies, and generating the analog bias based on the amplitude of the deterministic jitter.

Example 13 includes the subject matter of any one of Examples 9-12, including or omitting any elements as optional, wherein the estimation component is further configured to generate a determination of whether a phase drift between phases of the digital reference signal causes an integer ambiguity relative to an oscillator signal of a voltage controlled oscillator, and estimate the deterministic jitter.

Example 14 includes the subject matter of any one of Examples 9-13, including or omitting any elements as optional, wherein the estimation component is further configured to determine a first deterministic jitter estimation of the digital reference signal based on the oscillator signal, and a deterministic jitter estimation of the digital reference signal based on the oscillator signal, at different frequencies of the voltage controlled oscillator.

Example 15 includes the subject matter of any one of Examples 9-14, including or omitting any elements as optional, wherein the estimation component is further configured to determine the first deterministic jitter estimation and the second deterministic jitter estimation during a boot phase or a calibration phase of the digital phase locked loop that is before an operational transmission phase for active transmission or reception of wireless signals.

Example 16 includes the subject matter of any one of Examples 9-15, including or omitting any elements as optional, wherein the estimation component is further configured to eliminate odd signal harmonic spurs to the digital phase locked loop via the control loop.

Example 17 includes the subject matter of any one of Examples 9-16, including or omitting any elements as optional, wherein the estimation component is further configured to generate an adjustment of the analog bias by tracking one or more amplitudes of the deterministic jitter during the operational transmission phase, and enable another analog bias based on the adjustment to keep further estimations of the deterministic jitter at about zero.

Example 18 includes the subject matter of any one of Examples 9-17, including or omitting any elements as optional, wherein the doubler component is further configured to convert falling edges of the square wave into rising edges to generate the digital reference signal at the doubler output by doubling the square wave frequency of the square wave and generate at least a part of the deterministic jitter at the doubler output.

Example 19 is a system employed in a mobile device comprising: a reference oscillator configured to generate an analog reference signal along a reference path; a digital phase lock loop (DPLL), coupled to a local oscillator and the reference oscillator, configured to: determine an amplitude of a deterministic jitter in a digital domain from a doubler output of a doubler component that is coupled to the DPLL via a digital domain portion of the reference path; perform a digital correction based on the amplitude to a control loop of a feedback path from the DPLL to a signal shaper component; a control loop component configured to provides an analog bias based on the digital correction to modify a duty cycle of the signal shaper component in the analog domain and eliminate the deterministic jitter at the doubler output with the analog bias based on the digital correction.

Example 20 includes the subject matter of any one of Examples 19, including or omitting any elements as optional, wherein at least a part of the deterministic jitter is generated by the doubler component.

Example 21 includes the subject matter of any one of Examples 19-20, including or omitting any elements as optional, wherein the DPLL is further configured to: measure phases of a digital reference signal generated by the doubler component based on a phase of a voltage controlled oscillator signal of the local oscillator; and determine a degree of offset between the phases of the digital reference signal and the phase of the voltage controlled oscillator signal at a plurality of different frequencies associated with the local oscillator, wherein the determination of the amplitude of the deterministic jitter is based on the degree of offset.

Example 22 includes the subject matter of any one of Examples 19-21, including or omitting any elements as optional, wherein the DPLL is further configured to: generate the digital correction to take into account an integer ambiguity in phase measurements of the digital reference signal and a voltage controlled oscillator signal of the local oscillator based on a phase drift between the digital reference signal and the voltage controlled oscillator signal.

Example 23 includes the subject matter of any one of Examples 19-22, including or omitting any elements as optional, wherein the DPLL is further configured to: determine a first deterministic jitter estimation at a first frequency of the local oscillator during a boot phase or a calibration phase of the DPLL that is before an operational transmission phase where the DPLL is frequency locked; and determine a second deterministic jitter estimation at a second frequency of the local oscillator during the boot phase of the DPLL and before the operational transmission phase.

Example 24 includes the subject matter of any one of Examples 19-23, including or omitting any elements as optional, wherein the DPLL is further configured to: eliminate odd signal harmonic spurs that leak to an antenna port from the reference path or the DPLL.

Example 25 includes the subject matter of any one of Examples 19-24, including or omitting any elements as optional, wherein the DPLL is further configured to: generate a further adjustment of the analog bias by tracking one or more amplitudes of the deterministic jitter during the operational transmission phase and provide a different digital correction for the control loop component to generate a second analog bias based on the further adjustment and maintain the deterministic jitter at about zero.

Example 26 is a method for a digital phase locked loop (DPLL) system comprising: determining an amplitude of a deterministic jitter in a digital domain from a doubler output of a doubler component coupled to a DPLL via a digital domain portion of a reference path; providing a digital correction based on the amplitude to a control loop component of a feedback path from the DPLL to a shaper component; and providing, by the control loop component, an analog bias based on the digital correction to modify a duty cycle of the shaper component in the analog domain and eliminate the deterministic jitter at the doubler output with the analog bias.

Example 27 includes the subject matter of Example 26, including or omitting any elements as optional, further comprising: measuring phases of a digital reference signal generated by the doubler component based on a phase of a voltage controlled oscillator signal of a local oscillator; and determine a degree of offset between the phases of the digital reference signal and the phase of the voltage controlled oscillator signal at a plurality of different frequencies associated with the local oscillator, wherein the determination of the amplitude of the deterministic jitter is based on the degree of offset.

Example 28 includes the subject matter of any one of Examples 26-27, including or omitting any elements as optional, further comprising: generating the digital correction to take into account an integer ambiguity in phase measurements of the digital reference signal and a voltage controlled oscillator signal of a local oscillator based on a phase drift between the digital reference signal and the voltage controlled oscillator signal.

Example 29 includes the subject matter of any one of Examples 26-28, including or omitting any elements as optional, further comprising: determining a first deterministic jitter estimation at a first frequency of the local oscillator during a boot phase or a calibration phase of the DPLL that is before an operational transmission phase where the DPLL is frequency locked; and determining a second deterministic jitter estimation at a second frequency of the local oscillator during the boot phase of the DPLL and before the operational transmission phase.

Example 30 includes the subject matter of any one of Examples 26-29, including or omitting any elements as optional, further comprising: eliminating odd signal harmonic spurs that leak to an antenna port from the reference path coupled to the DPLL.

Example 31 includes the subject matter of any one of Examples 26-30, including or omitting any elements as optional, further comprising: generating a further adjustment of the analog bias by tracking one or more amplitudes of the deterministic jitter during the operational transmission phase and provide a different digital correction for the control loop component to generate a second analog bias based on the further adjustment and maintain the deterministic jitter at about zero.

Example 32 is a system for a digital phase locked loop (DPLL) comprising: means for determining an amplitude of a deterministic jitter in a digital domain from a doubler output of a doubler component coupled to a DPLL via a digital domain portion of a reference path; means for providing a digital correction based on the amplitude to a control loop component of a feedback path from the DPLL to a shaper component; and means for providing, by the control loop component, an analog bias based on the digital correction to modify a duty cycle of the shaper component in the analog domain and eliminate the deterministic jitter at the doubler output with the analog bias.

Example 33 includes the subject matter of Example 32, including or omitting any elements as optional, further comprising: means for measuring phases of a digital reference signal generated by the doubler component based on a phase of a voltage controlled oscillator signal of a local oscillator; and means for determining a degree of offset between the phases of the digital reference signal and the phase of the voltage controlled oscillator signal at a plurality of different frequencies associated with the local oscillator, wherein the determination of the amplitude of the deterministic jitter is based on the degree of offset.

Example 34 includes the subject matter of any one of Examples 32-33, including or omitting any elements as optional, further comprising: means for generating the digital correction to take into account an integer ambiguity in phase measurements of the digital reference signal and a voltage controlled oscillator signal of a local oscillator based on a phase drift between the digital reference signal and the voltage controlled oscillator signal.

Example 35 includes the subject matter of any one of Examples 32-34, including or omitting any elements as optional, further comprising: means for determining a first deterministic jitter estimation at a first frequency of the local oscillator during a boot phase or a calibration phase of the DPLL that is before an operational transmission phase where the DPLL is frequency locked; and means for determining a second deterministic jitter estimation at a second frequency of the local oscillator during the boot phase of the DPLL and before the operational transmission phase.

Example 36 includes the subject matter of any one of Examples 32-35, including or omitting any elements as optional, further comprising: means for eliminating odd signal harmonic spurs that leak to an antenna port from the reference path coupled to the DPLL.

Example 37 includes the subject matter of any one of Examples 32-36, including or omitting any elements as optional, further comprising: means for generating a further adjustment of the analog bias by tracking one or more amplitudes of the deterministic jitter during the operational transmission phase and provide a different digital correction for the control loop component to generate a second analog bias based on the further adjustment and maintain the deterministic jitter at about zero.

Example 38 includes the subject matter of any one of Examples 32-37, including or omitting any elements as optional, wherein at least a part of the deterministic jitter is generated by the doubler component.

It is to be understood that aspects described herein can be implemented by hardware, software, firmware, or any combination thereof. When implemented in software, functions can be stored on or transmitted over as one or more instructions or code on a computer-readable medium. Computer-readable media includes both computer storage media and communication media including any medium that facilitates transfer of a computer program from one place to another. A storage media or a computer readable storage device can be any available media that can be accessed by a general purpose or special purpose computer. By way of example, and not limitation, such computer-readable media can comprise RAM, ROM, EEPROM, CD-ROM or other optical disk storage, magnetic disk storage or other magnetic storage devices, or other tangible and/or non-transitory medium, that can be used to carry or store desired information or executable instructions. Also, any connection is properly termed a computer-readable medium. For example, if software is transmitted from a website, server, or other remote source using a coaxial cable, fiber optic cable, twisted pair, digital subscriber line (DSL), or wireless technologies such as infrared, radio, and microwave, then coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

Various illustrative logics, logical blocks, modules, and circuits described in connection with aspects disclosed herein can be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform functions described herein. A general-purpose processor can be a microprocessor, but, in the alternative, processor can be any conventional processor, controller, microcontroller, or state machine. A processor can also be implemented as a combination of computing devices, for example, a combination of a DSP and a microprocessor, a plurality of microprocessors, one or more microprocessors in conjunction with a DSP core, or any other such configuration. Additionally, at least one processor can comprise one or more modules operable to perform one or more of the s and/or actions described herein.

For a software implementation, techniques described herein can be implemented with modules (e.g., procedures, functions, and so on) that perform functions described herein. Software codes can be stored in memory units and executed by processors. Memory unit can be implemented within processor or external to processor, in which case memory unit can be communicatively coupled to processor through various means as is known in the art. Further, at least one processor can include one or more modules operable to perform functions described herein.

Techniques described herein can be used for various wireless communication systems such as CDMA, TDMA, FDMA, OFDMA, SC-FDMA and other systems. The terms "system" and "network" are often used interchangeably. A CDMA system can implement a radio technology such as Universal Terrestrial Radio Access (UTRA), CDMA1800, etc. UTRA includes Wideband-CDMA (W-CDMA) and other variants of CDMA. Further, CDMA1800 covers IS-1800, IS-95 and IS-856 standards. A TDMA system can implement a radio technology such as Global System for Mobile Communications (GSM). An OFDMA system can implement a radio technology such as Evolved UTRA (E-UTRA), Ultra Mobile Broadband (UMB), IEEE 802.11 (Wi-Fi), IEEE 802.16 (WiMAX), IEEE 802.18, Flash-OFDML, etc. UTRA and E-UTRA are part of Universal Mobile Telecommunication System (UMTS). 3GPP Long Term Evolution (LTE) is a release of UMTS that uses E-UTRA, which employs OFDMA on downlink and SC-FDMA on uplink. UTRA, E-UTRA, UMTS, LTE and GSM are described in documents from an organization named "3rd Generation Partnership Project" (3GPP). Additionally, CDMA1800 and UMB are described in documents from an organization named "3rd Generation Partnership Project 2" (3GPP2). Further, such wireless communication systems can additionally include peer-to-peer (e.g., mobile-to-mobile) ad hoc network systems often using unpaired unlicensed spectrums, 802.xx wireless LAN, BLUETOOTH and any other short- or long-range, wireless communication techniques.

Single carrier frequency division multiple access (SC-FDMA), which utilizes single carrier modulation and frequency domain equalization is a technique that can be utilized with the disclosed aspects. SC-FDMA has similar performance and essentially a similar overall complexity as those of OFDMA system. SC-FDMA signal has lower peak-to-average power ratio (PAPR) because of its inherent single carrier structure. SC-FDMA can be utilized in uplink communications where lower PAPR can benefit a mobile terminal in terms of transmit power efficiency.

Moreover, various aspects or features described herein can be implemented as a method, apparatus, or article of manufacture using standard programming and/or engineering techniques. The term "article of manufacture" as used herein is intended to encompass a computer program accessible from any computer-readable device, carrier, or media. For example, computer-readable media can include but are not limited to magnetic storage devices (e.g., hard disk, floppy disk, magnetic strips, etc.), optical disks (e.g., compact disk (CD), digital versatile disk (DVD), etc.), smart cards, and flash memory devices (e.g., EPROM, card, stick, key drive, etc.). Additionally, various storage media described herein can represent one or more devices and/or other machine-readable media for storing information. The term "machine-readable medium" can include, without being limited to, wireless channels and various other media capable of storing, containing, and/or carrying instruction(s) and/or data. Additionally, a computer program product can include a computer readable medium having one or more instructions or codes operable to cause a computer to perform functions described herein.

Communications media embody computer-readable instructions, data structures, program modules or other structured or unstructured data in a data signal such as a modulated data signal, e.g., a carrier wave or other transport mechanism, and includes any information delivery or transport media. The term "modulated data signal" or signals refers to a signal that has one or more of its characteristics set or changed in such a manner as to encode information in one or more signals. By way of example, and not limitation, communication media include wired media, such as a wired network or direct-wired connection, and wireless media such as acoustic, RF, infrared and other wireless media.

Further, the actions of a method or algorithm described in connection with aspects disclosed herein can be embodied directly in hardware, in a software module executed by a processor, or a combination thereof. A software module can reside in RAM memory, flash memory, ROM memory, EPROM memory, EEPROM memory, registers, a hard disk, a removable disk, a CD-ROM, or any other form of storage medium known in the art. An exemplary storage medium can be coupled to processor, such that processor can read information from, and write information to, storage medium. In the alternative, storage medium can be integral to processor. Further, in some aspects, processor and storage medium can reside in an ASIC. Additionally, ASIC can reside in a user terminal. In the alternative, processor and storage medium can reside as discrete components in a user terminal. Additionally, in some aspects, the s and/or actions of a method or algorithm can reside as one or any combination or set of codes and/or instructions on a machine-readable medium and/or computer readable medium, which can be incorporated into a computer program product.

The above description of illustrated embodiments of the subject disclosure, including what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

In particular regard to the various functions performed by the above described components (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the disclosure. In addition, while a particular feature may have been disclosed with respect to only one of several implementations, such feature may be combined with one or more other features of the other implementations as may be desired and advantageous for any given or particular application.

What is claimed is:

1. An apparatus employed in a mobile device with a digital phase lock loop comprising:
   a reference clock component comprising a crystal configured to provide an analog reference signal to a reference path in an analog domain;
   a signal shaper component configured to shape the analog reference signal into a square signal, and provide the square signal in a digital domain to a shaper output of the reference path;
   a doubler component configured to approximately double the square signal to generate a digital reference signal, and provide the digital reference signal at a doubler output of the reference path to estimate of deterministic jitter based on a local oscillator signal of a local oscillator and the digital reference signal; and
   a control loop coupling a digital domain portion of the reference path to an analog domain portion of the reference path with a feedback path to provide an analog bias signal in the analog domain to the shaper, and eliminate the deterministic jitter in the digital domain with the analog bias signal.

2. The apparatus of claim 1, further comprising:
   an estimation component configured to generate an estimation of the deterministic jitter, generate a digital correction based on the estimation, and provide the digital correction to the feedback path to correct a duty cycle at the shaper output of the signal shaper component with the analog bias signal based on the digital correction.

3. The apparatus of claim 2, wherein the estimation component is further configured to modify the duty cycle of the shaper to be less than about 50% and greater than about 0%, or greater than about 50% and less than about 100% based on the digital correction.

4. The apparatus of claim 2, wherein the estimation component is further configured to estimate the deterministic jitter at the doubler output based on an integer ambiguity in phase cycles between the digital reference signal and the local oscillator signal, at different frequency levels of the local oscillator.

5. The apparatus of claim 2, wherein the estimation component is further configured to eliminate a leakage of odd signal harmonics at an antenna port coupled that is coupled to the digital phase lock loop.

6. The apparatus of claim 2, wherein the estimation component is further configured to generate the digital correction during a boot phase or an initial calibration phase of the digital phase lock loop that is before an operational transmission phase for transmission or reception of wireless signals, and generate an adjustment to the analog bias signal by tracking one or more amplitudes of the deterministic jitter during an operational transmission phase to generate a second digital correction based on the adjustment to keep further estimations of the deterministic jitter at about zero during the transmission or reception.

7. The apparatus of claim 1, further comprising:
   a time to digital converter (TDC) configured to compare phases of the digital reference signal and the local oscillator signal of the local oscillator, at different frequencies of the local oscillator; and
   an estimation component configured to determine an amplitude of the deterministic jitter based on a degree of a difference between the phases, and generate the digital correction to the feedback path;
   wherein the control loop comprises a digital-to-analog converter configured to generate the analog bias signal based on the digital correction to correct for an integer ambiguity based on the degree of the difference.

8. The apparatus of claim 1, wherein the doubler component is further configured to generate at least a part of the deterministic jitter at the doubler output.

9. A system for a digital phase locked loop comprising:
   a crystal oscillator coupled to a signal shaper component, wherein the signal shaper component is configured to provide a square wave at a shaper output based on an analog signal from the crystal oscillator in an analog domain along an analog portion of a reference signal path;
   a doubler component, coupled to the signal shaper component downstream of the reference signal path, configured to provide a digital reference signal to a doubler output in a digital domain along a digital portion of the reference signal path to the DPLL by approximately doubling a square wave frequency of the square wave; and
   an estimation component configured to generate an estimation of a deterministic jitter in the digital domain and provide a digital correction that is based on the estimation in the digital domain to a feedback path;
   a control loop coupling the feedback path to the digital phase locked loop and to the signal shaper component, configured to provide an analog bias to the signal shaper component in the analog domain based on the digital correction from the estimation of the deterministic jitter in the digital domain, and eliminate the deterministic jitter at the doubler output with the analog bias in the analog domain.

10. The system of claim 9, wherein a digital-to-analog converter of the control loop is configured to adjust a duty cycle at the shaper output of the signal shaper component and eliminate the deterministic jitter that is estimated in the digital domain by providing the analog bias to the signal shaper component in the analog domain.

11. The system of claim 9, wherein the estimation component is further configured to generate the estimation of the deterministic jitter based on one or more calibration processes that factor an integer ambiguity in phase measurements of the digital reference signal and of an oscillator signal from an oscillator, and further calibrate the signal shaper component with a voltage bias signal as the analog bias.

12. The system of claim 11, wherein the estimation component comprises a time-to-digital converter (TDC) configured to perform the one or more calibration processes by comparing phases of the digital reference signal based on the oscillator signal of the oscillator, determining an amplitude of the deterministic jitter based on an offset between the phases of the digital reference signal and a cycle of the oscillator signal, at a plurality of frequencies, and generating the analog bias based on the amplitude of the deterministic jitter.

13. The system of claim 9, wherein the estimation component is further configured to generate a determination of whether a phase drift between phases of the digital reference signal causes an integer ambiguity relative to an oscillator signal of a voltage controlled oscillator, and estimate the deterministic jitter.

14. The system of claim 13, wherein the estimation component is further configured to determine a first deterministic jitter estimation of the digital reference signal based on the oscillator signal, and a deterministic jitter estimation of the digital reference signal based on the oscillator signal, at different frequencies of the voltage controlled oscillator.

15. The system of claim 14, wherein the estimation component is further configured to determine the first deterministic jitter estimation and the second deterministic jitter estimation during a boot phase or a calibration phase of the digital phase locked loop that is before an operational transmission phase for active transmission or reception of wireless signals.

16. The system of claim 15, wherein the estimation component is further configured to eliminate odd signal harmonic spurs to the digital phase locked loop via the control loop.

17. The system of claim 15, wherein the estimation component is further configured to generate an adjustment of the analog bias by tracking one or more amplitudes of the deterministic jitter during the operational transmission phase, and enable another analog bias based on the adjustment to keep further estimations of the deterministic jitter at about zero.

18. The system of claim 9, wherein the doubler component is further configured to convert falling edges of the square wave into rising edges to generate the digital reference signal at the doubler output by doubling the square wave frequency of the square wave and generate at least a part of the deterministic jitter at the doubler output.

19. A system employed in a mobile device comprising:
a reference oscillator configured to generate an analog reference signal along a reference path;
a digital phase lock loop (DPLL), coupled to a local oscillator and the reference oscillator, configured to:
determine an amplitude of a deterministic jitter in a digital domain from a doubler output of a doubler component that is coupled to the DPLL via a digital domain portion of the reference path;
perform a digital correction based on the amplitude to a control loop of a feedback path from the DPLL to a signal shaper component;
a control loop component configured to provides an analog bias based on the digital correction to modify a duty cycle of the signal shaper component in the analog domain and eliminate the deterministic jitter at the doubler output with the analog bias based on the digital correction.

20. The system of claim 19, wherein at least a part of the deterministic jitter is generated by the doubler component.

21. The system of claim 19, wherein the DPLL is further configured to:
measure phases of a digital reference signal generated by the doubler component based on a phase of a voltage controlled oscillator signal of the local oscillator; and
determine a degree of offset between the phases of the digital reference signal and the phase of the voltage controlled oscillator signal at a plurality of different frequencies associated with the local oscillator, wherein the determination of the amplitude of the deterministic jitter is based on the degree of offset.

22. The system of claim 19, wherein the DPLL is further configured to:
generate the digital correction to take into account an integer ambiguity in phase measurements of the digital reference signal and a voltage controlled oscillator signal of the local oscillator based on a phase drift between the digital reference signal and the voltage controlled oscillator signal.

23. The system of claim 22, wherein the DPLL is further configured to:
determine a first deterministic jitter estimation at a first frequency of the local oscillator during a boot phase or a calibration phase of the DPLL that is before an operational transmission phase where the DPLL is frequency locked; and
determine a second deterministic jitter estimation at a second frequency of the local oscillator during the boot phase of the DPLL and before the operational transmission phase.

24. The system of claim 23, wherein the DPLL is further configured to:
eliminate odd signal harmonic spurs that leak to an antenna port from the reference path or the DPLL.

25. The system of claim 23, wherein the DPLL is further configured to:
generate a further adjustment of the analog bias by tracking one or more amplitudes of the deterministic jitter during the operational transmission phase and provide a different digital correction for the control loop component to generate a second analog bias based on the further adjustment and maintain the deterministic jitter at about zero.

* * * * *